(12) United States Patent
Shimada et al.

(10) Patent No.: US 8,252,490 B2
(45) Date of Patent: Aug. 28, 2012

(54) COLOR FILTER AND SOLID STATE IMAGING DEVICE HAVING A COLORED PATTERN FORMED FROM A CURABLE COMPOSITION

(75) Inventors: Kazuto Shimada, Shizuoka-ken (JP); Yushi Kaneko, Shizuoka-ken (JP); Tomotaka Tsuchimura, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 13/186,926

(22) Filed: Jul. 20, 2011

(65) Prior Publication Data
US 2011/0287235 A1    Nov. 24, 2011

Related U.S. Application Data

(62) Division of application No. 12/170,908, filed on Jul. 10, 2008, now Pat. No. 8,008,364.

(30) Foreign Application Priority Data

Jul. 13, 2007    (JP) ................................. 2007-184661

(51) Int. Cl.
*G03F 1/00*    (2012.01)
(52) U.S. Cl. ......... 430/7; 252/582; 252/586; 430/270.1; 522/75; 522/78
(58) Field of Classification Search .................. 252/582, 252/586; 430/7, 270.1; 522/75, 78
See application file for complete search history.

(56) References Cited

U.S. PATENT DOCUMENTS 6,730,714 B2    5/2004    Ylitalo et al.

FOREIGN PATENT DOCUMENTS

| EP | 1092710 A1 | 4/2001 |
|----|------------|--------|
| EP | 1191078 A2 | 3/2002 |
| EP | 1790696 A1 | 5/2007 |
| EP | 2006310 A2 | 12/2008 |
| JP | 2-127602 A | 5/1990 |
| JP | 2000-239554 | 9/2000 |
| JP | 2002-241640 A | 8/2002 |
| JP | 2006-30541 A | 2/2006 |
| JP | 2007-131793 A | 5/2007 |

OTHER PUBLICATIONS

Office Action issued in corresponding Japanese Patent Application No. 2007-184661 dated May 8, 2012.

*Primary Examiner* — David W Wu
*Assistant Examiner* — Marie Reddick
(74) *Attorney, Agent, or Firm* — Buchanan Ingersoll & Rooney PC

(57) ABSTRACT

A color filter or solid state imaging device comprising a colored pattern formed from a curable composition which includes (A) a pigment, (B) a compound having a defined cyclic urea structure and having an acid group or a basic group, (C) a dispersant, (D) a solvent, (E) a radical polymerizable compound, and (F) a photopolymerization initiator. The pigment may be a pigment having a urea structure or an imide structure. The pigment may also be a pigment having a barbituric skeleton.

16 Claims, No Drawings

COLOR FILTER AND SOLID STATE IMAGING DEVICE HAVING A COLORED PATTERN FORMED FROM A CURABLE COMPOSITION

CROSS REFERENCE TO RELATED APPLICATIONS

This application is a divisional of U.S. patent application Ser. No. 12/170,908, filed Jul. 10, 2008, now U.S. Pat. No. 8,008,364 which in turn claims priority under 35 U.S.C. §119 of Japanese Patent Application No. 2007-184661, filed on Jul. 13, 2007, each hereby expressly incorporated by reference in its entirety herein.

BACKGROUND OF THE INVENTION

1. Field of the Invention

The present invention relates to a pigment dispersion liquid having excellent dispersion stability of pigment, a curable composition which is obtained by using the same and which is suitable for preparing a color filter to be used for a liquid crystal display (LCD), a solid state imaging device (for example, a CCD or CMOS) or the like, a color filer having a colored pattern formed from the curable composition, and a solid state imaging device.

2. Description of the Related Art

A color filer is an indispensable constitutional component in a liquid crystal display or a solid state imaging device.

In comparison with a display using a cathode ray tube (CRT: Braun tube) as a display device, a liquid crystal display (LCD) is compact and has an equal or higher performance. Therefore, LCDs have come to be the mainstream for television screens, personal computer screens and other display apparatus. Also, in recent years, the trend in development of liquid crystal displays is moving, from conventional monitor applications in which the screen has a relatively small area, toward TV applications in which the screen is large and a high image quality is required.

In the field of color filters for liquid crystal displays, the substrate size is enlarged in order to produce a large-sized TV, and curing with low energy is desired for the purpose of improving the productivity when using a large-sized substrate. Also, in the field of liquid crystal displays for TVs, a higher image quality is required as compared with that for a conventional monitor. That is, improvements in contrast and color purity are required. For the purpose of improving the contrast, with respect to a curable composition to be used in the preparation of a color filter, a finer particle size is required for a coloring agent (for example, organic pigments) to be used (see, for example, JP-A No. 2006-30541). Accompanying this, the addition amount of a dispersant for dispersing a pigment tends to increase. Also, for the purpose of improving the color purity, a higher content of a coloring agent (for example, organic pigments) in the solid content of the curable composition is required. Accordingly, the contents of a photopolymerization initiator and a photopolymerizable monomer in the solid content of the curable composition tend to decrease.

On the other hand, curing with low energy is also desired in the field of color filters for solid state imaging devices. Also, production of thinner patterns is advancing, and accompanying this, the concentration of a pigment in the composition is increasing. Furthermore, in a pigment type color filter, along with the use of a small particle size pigment, a proportion of a pigment dispersant in the composition tends to increase.

Also, in order to deal with a problem such as color unevenness, which is caused since the pigment has relatively coarse particles, a technology has been proposed which uses an organic solvent-soluble dye as the coloring agent in place of the pigment (see, for example, JP-A No. 2-127602). However, there are cases where the dye exhibits a polymerization inhibition effect derived from its structure. In a color filter in which a dye is used as a coloring agent, since the concentration of the dye increases, the problem of the polymerization inhibition effect derived from the dye becomes remarkable, and it is difficult to realize a high density colored layer using a dye.

Accompanying thinning of the colored layer, the content ratios of a coloring agent in a curable composition for forming the colored layer, namely a pigment and a pigment dispersant, increase, whereas the content ratios of curing components (a polymerizable component and a polymerization initiator) become relatively low. Accordingly, there is a problem generated in that the sensitivity cannot be sufficiently secured. Also, the addition amounts of a polymer having a high acid value, a development accelerator and the like to be added to the curable composition for the purpose of securing developability relatively decrease, and therefore, there is apprehension that defective development is caused.

As described above, in the case where sufficient curability and developability are not obtained, the colored pattern forming properties are lowered, and the performance of the obtained color filter is reduced. This problem is remarkable in a solid state imaging device which is required to have fine pattern forming properties.

For the purpose of securing sensitivity and developability, it is desired to decrease the ratios of a pigment and a pigment dispersant. However, in order to achieve desired color value and spectral characteristics, it is not preferable to decrease the content of the pigment, and it is being attempted to decrease the amount of the pigment dispersant. However, in general, when the amount of the dispersant is decreased, sufficient dispersion stability of pigment is not obtained, resulting in a problem in that an increase in viscosity is caused over time.

In particular, in a pigment having a barbituric skeleton, such as yellow pigments, a decrease in dispersion stability of pigment over time is remarkable, and it is the present state that a pigment dispersion liquid which is able to achieve stable dispersion with a small amount of a dispersant is required.

As described above, in order to realize a colored pattern having a sufficient color forming property even in a thin layer, a colored curable composition is earnestly desired which has excellent pattern forming properties such as sensitivity and developability even in the case where a coloring agent is contained in a high concentration.

SUMMARY OF THE INVENTION

According to an aspect of the invention, there is provided a pigment dispersion liquid comprising (A) a pigment, (B) a compound having a cyclic urea structure and having an acid group or a basic group, (C) a dispersant, and (D) a solvent.

DETAILED DESCRIPTION OF THE INVENTION

The invention is hereunder described in detail.
[Pigment Dispersion Liquid]
The pigment dispersion liquid of the invention comprises (A) a pigment, (B) a compound having a cyclic urea structure and having an acid group or a basic group, (C) a dispersant, and (D) a solvent. These components are successively described below.

First of all, the (B) compound having a cyclic urea structure and having an acid group or a basic group (this compound will be hereinafter appropriately referred to as "(B) specified compound"), which is a characteristic component of the invention, is described.

<(B) Compound Having a Cyclic Urea Structure and Having an Acid Group or a Basic Group>

The compound having a cyclic urea structure and having an acid group or a basic group in the invention is a compound having a partial structure of —N—CO—N— in a cyclic structure as represented by the following formula (I) and having an acid group or a basic partial structure (basic group) as a substituent in a molecule thereof.

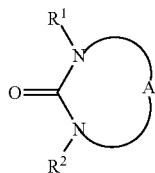

(I)

In the foregoing formula (I), $R^1$ and $R^2$ each independently represent a hydrogen atom, an alkyl group, an aryl group, an alkenyl group or an alkynyl group. When $R^1$ and $R^2$ each represent an alkyl group, an aryl group, an alkenyl group or an alkynyl group, each of these groups may have a substituent.

A represents a divalent linking group that links two nitrogen atoms included in this ring structure and may be one fused with an aromatic ring.

Each of $R^1$, $R^2$ and A may further have a substituent. Examples of the substituent which can be introduced include an alkyl group, an aryl group, an alkenyl group, alkynyl group, a cyclic alkyl group, a cyclic alkenyl group, a cyclic alkynyl group, a hydroxyl group, a thiol group, an ether group, a thioether group, a sulfo group, a sulfonamide group, a carbonyl group, an alkoxycarbonyl group, an aryloxycarbonyl group, a thiocarbonyl group, a urea group, a urethane group, an amide group, a heterocyclic group and substituents containing such a group.

However, any one of $R^1$, $R^2$ and A in the formula (I) has an acid group or a basic group.

The acid group or basic group included in the (B) specified compound secures dispersibility through a good interaction with an acid group and/or an amino group included in the (C) dispersant such as a dispersion resin to be used for the purpose of stably dispersing the pigment in the solvent. The (B) specified compound forms a good interaction with a pigment having an amide group and/or a urea group due to the cyclic urea structure existing in the molecule thereof, whereby the dispersion stability is improved.

Examples of the acid group include a phenol group, a carboxyl group, a sulfonic acid group, a phosphoric acid group, a sulfinic acid group and a monosulfate ester group.

Examples of the basic group include an amino group, examples of which include a primary amino group, a secondary amino group, a tertiary amino group, a cyclic secondary amino group, a cyclic tertiary amino group and an amino group-containing aromatic ring such as a pyridine ring. Conjugate acid groups and conjugate bases thereof can also be used.

From the viewpoint of interaction properties, a carboxyl group, a sulfonic acid group and salts thereof are preferable as the acid group; and from the viewpoint of interaction properties, a tertiary amino group is preferable as the basic group.

The cyclic urea structure is more preferably a 6-membered urea structure represented by the following formula (II).

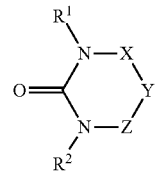

(II)

In the formula (II), $R^1$ and $R^2$ are synonymous with those in the foregoing formula (I).

X, Y and Z each independently represent a carbonyl group, an optionally substituted methylene group, an oxygen atom, a sulfur atom, —NH— or —NR$^3$—. Here, $R^3$ represents an alkyl group, an aryl group, an alkenyl group or an alkynyl group. $R^3$ may further have a substituent. Examples of the substituent which can be introduced include an alkyl group, an aryl group, an alkenyl group, an alkynyl group, a cyclic alkyl group, a cyclic alkenyl group, a cyclic alkynyl group, a hydroxyl group, a thiol group, an ether group, a thioether group, a sulfo group, a sulfonamide group, a carbonyl group, an alkoxycarbonyl group, an aryloxycarbonyl group, a thiocarbonyl group, a urea group, a urethane group, an amide group, a heterocyclic group and substituents containing such a group.

However, at least one of $R^1$, $R^2$, X, Y and Z has an acid group or an amino group.

As the most preferable structure of the (B) specified compound, a compound represented by the following formula (III) is exemplified.

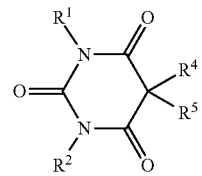

(III)

In the formula (III), $R^1$ and $R^2$ are synonymous with those in the foregoing formula (I); and $R^4$ and $R^5$ each independently represent a hydrogen atom, an alkyl group, an aryl group, an alkenyl group or an alkynyl group. Each of $R^4$ and $R^5$ may further have a substituent. Examples of the substituent which can be introduced include an alkyl group, an aryl group, an alkenyl group, an alkynyl group, a cyclic alkyl group, a cyclic alkenyl group, a cyclic alkynyl group, a hydroxyl group, a thiol group, an ether group, a thioether group, a sulfo group, a sulfonamide group, a carbonyl group, an alkoxycarbonyl group, an aryloxycarbonyl group, a thiocarbonyl group, a urea group, a urethane group, an amide group, a heterocyclic group and substituents containing such a group.

Specific examples of the (B) specified compound which can be used in the invention will be given below, but it should not be construed that the invention is limited thereto.

5
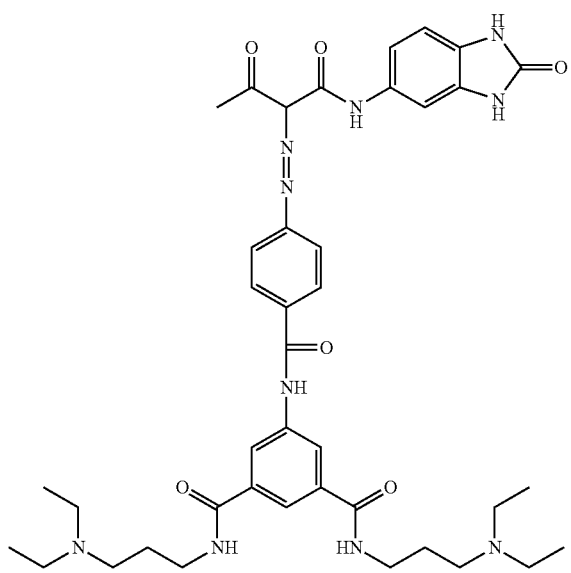
6
-continued
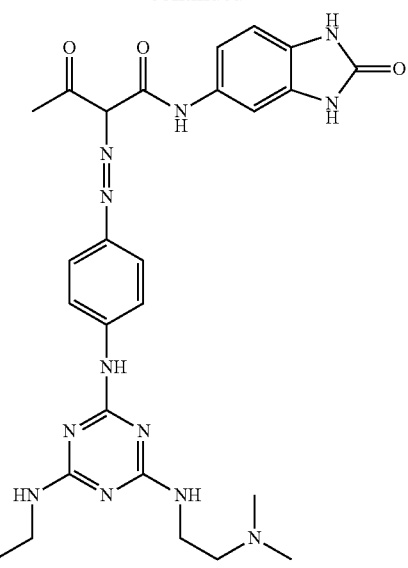
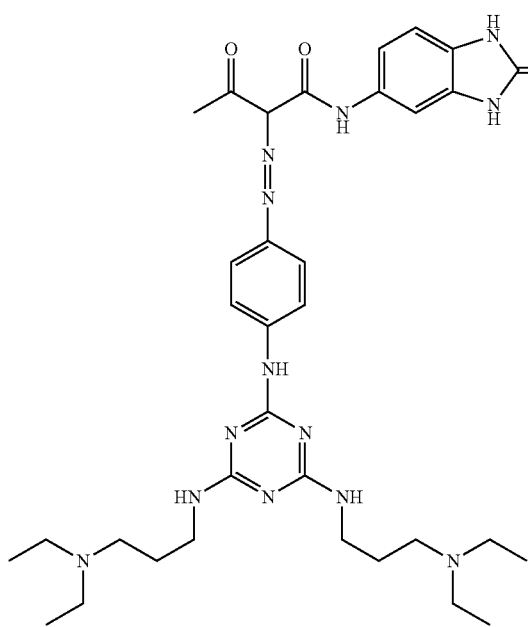
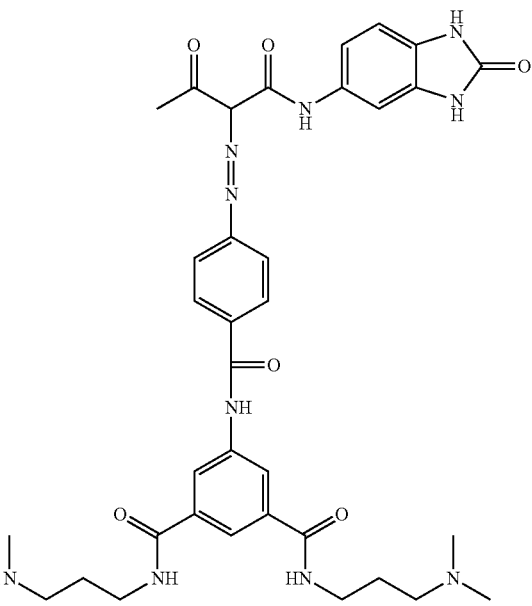

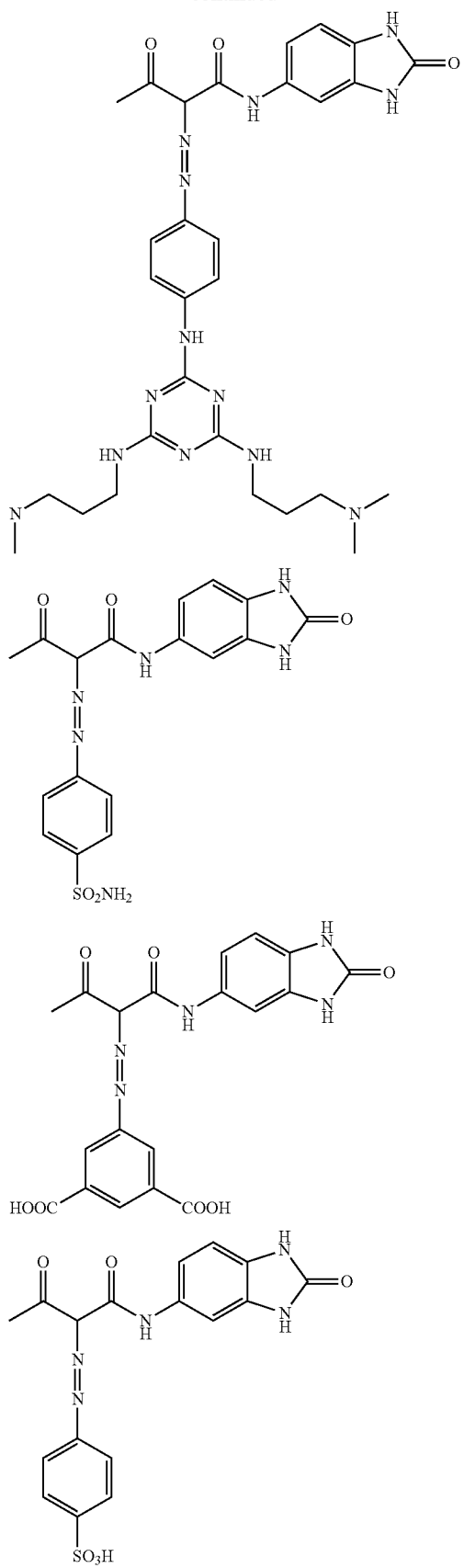
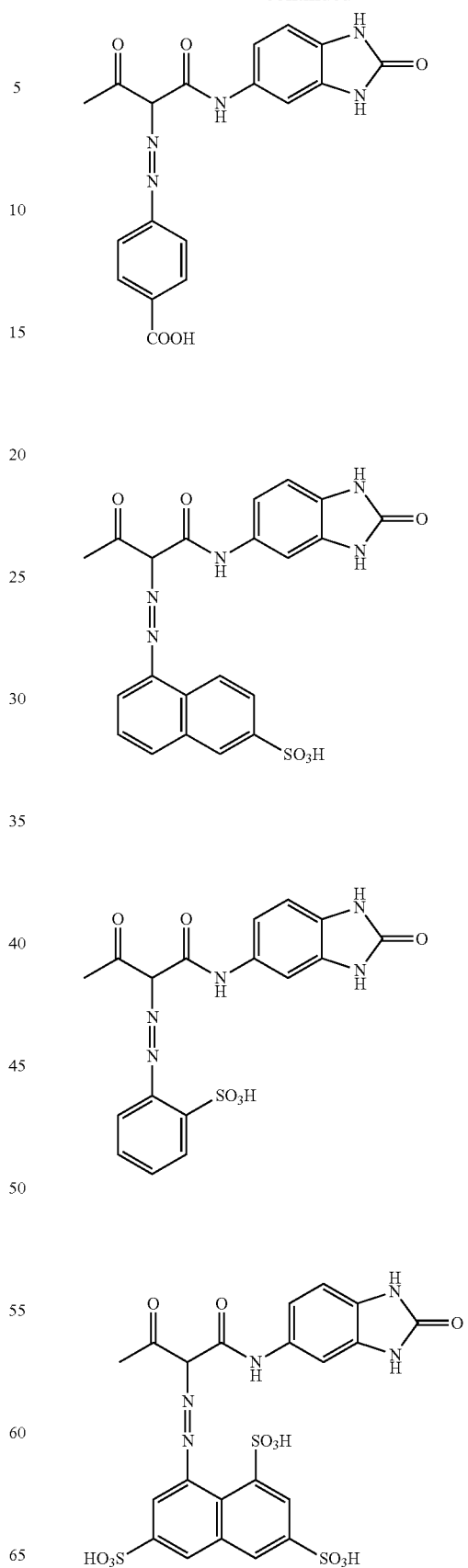

-continued
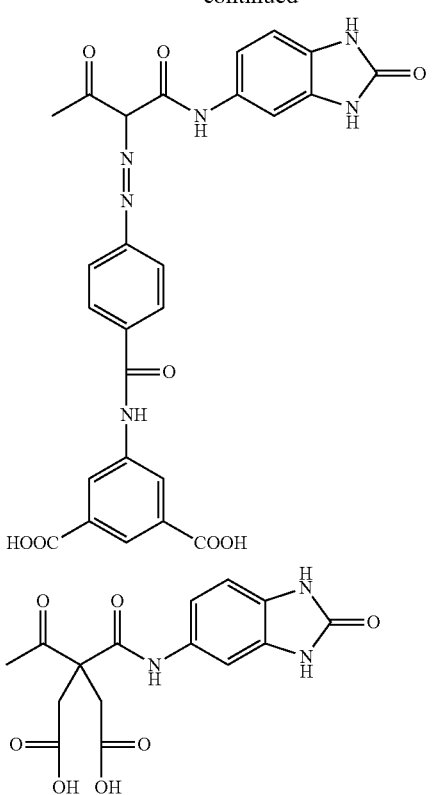
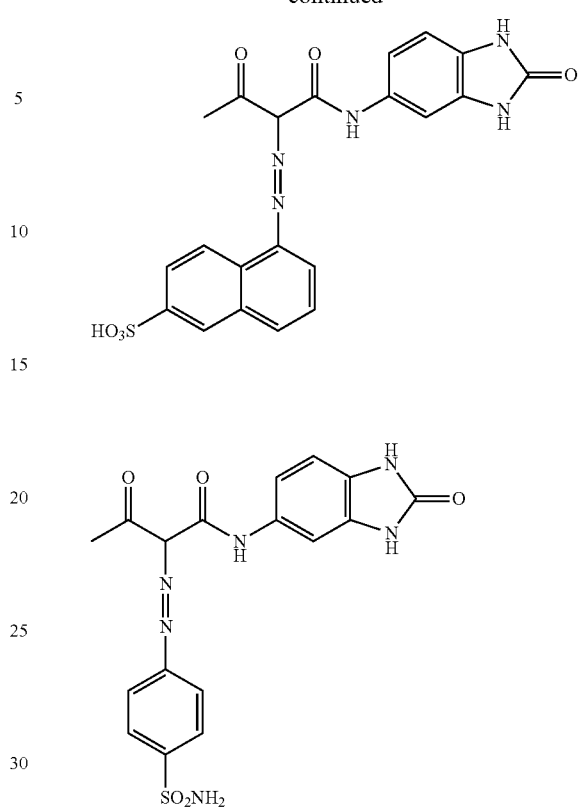
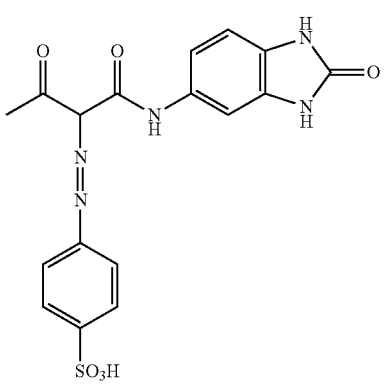
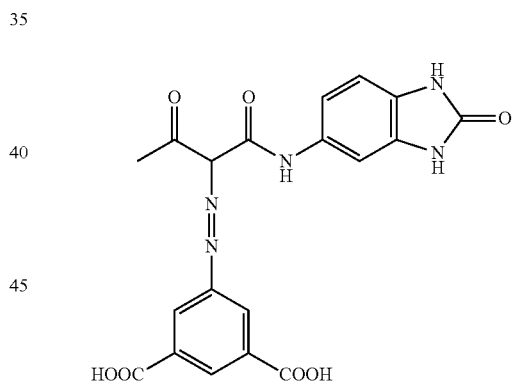
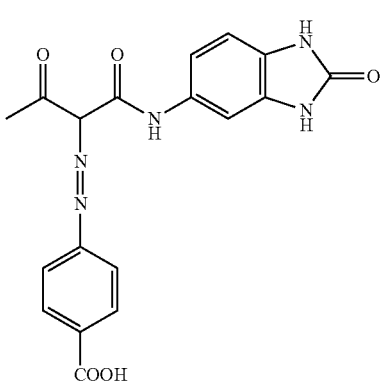
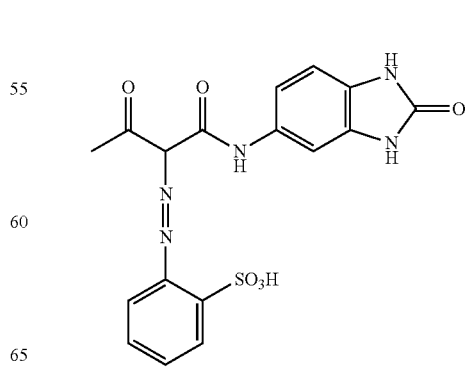

-continued
11
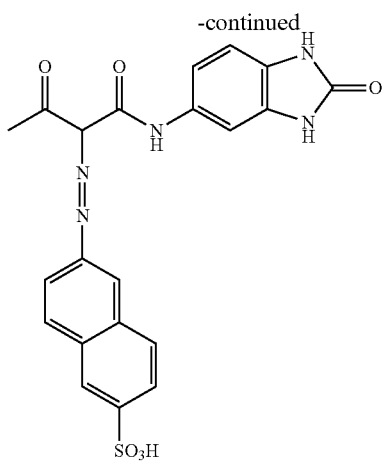
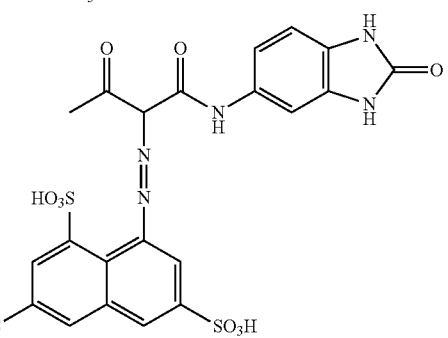
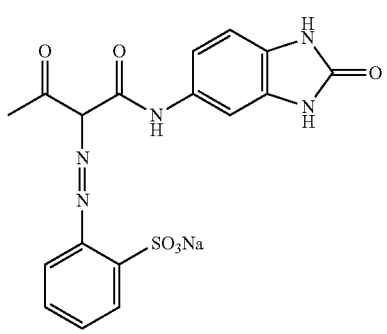
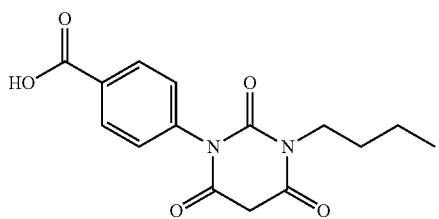
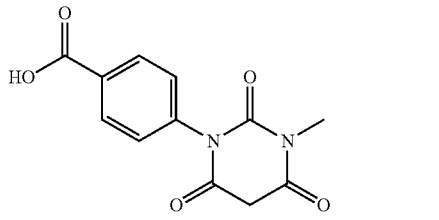
-continued
12
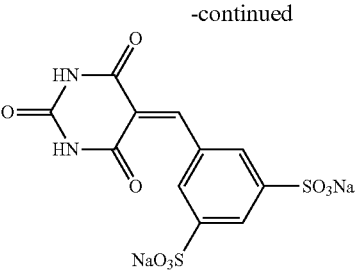
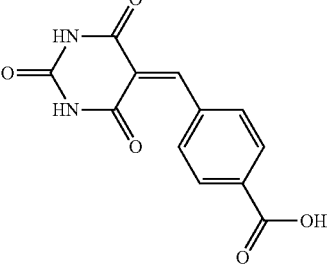
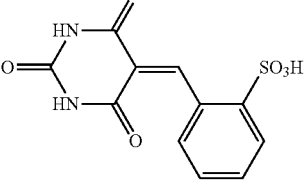
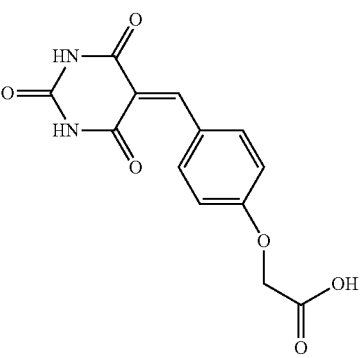
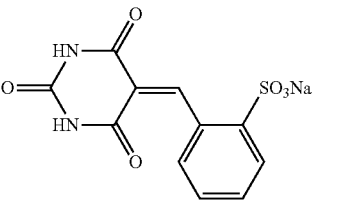
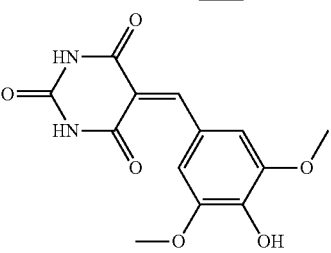

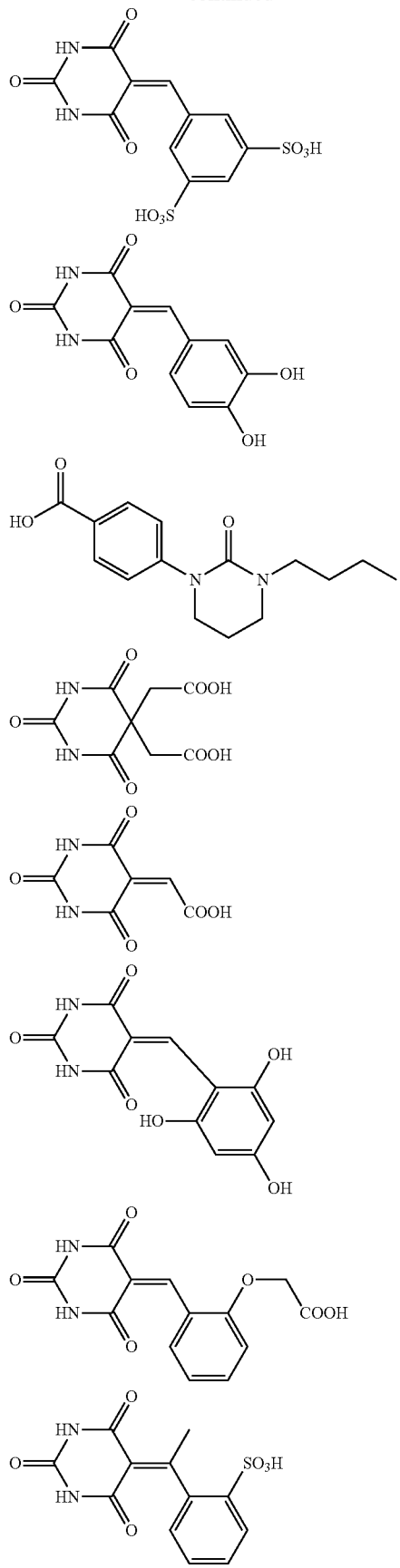
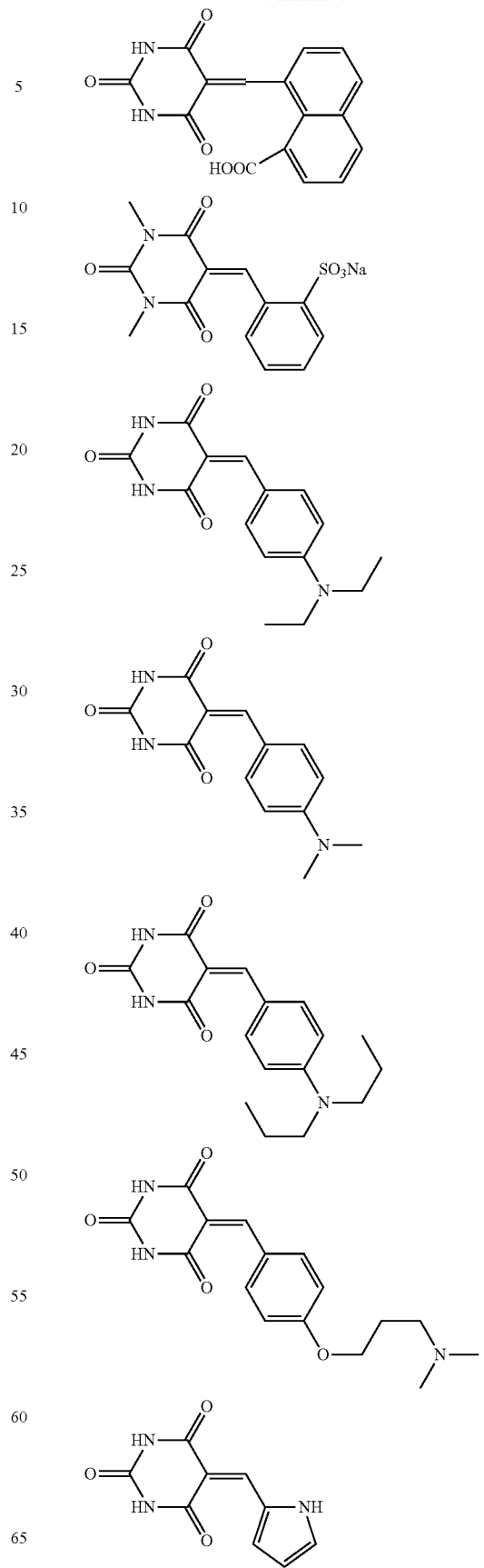

15
-continued
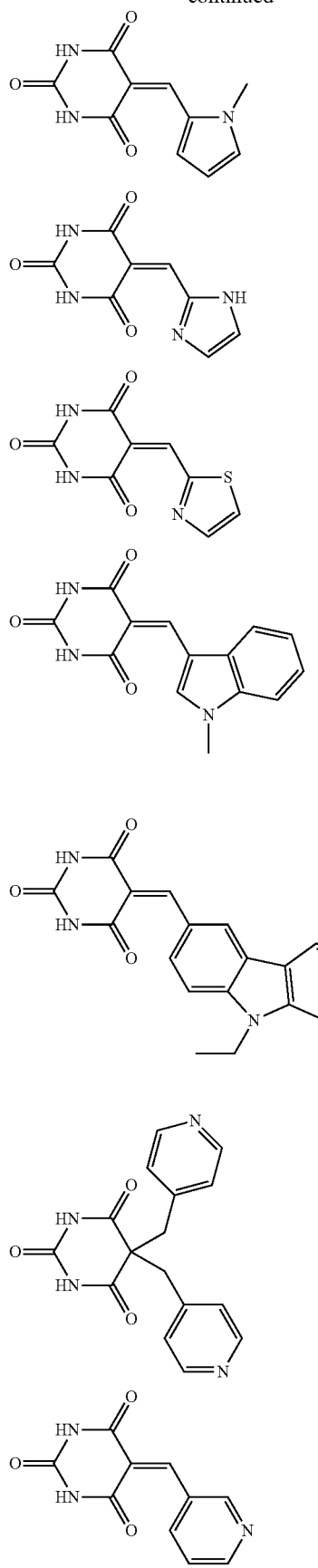
16
-continued
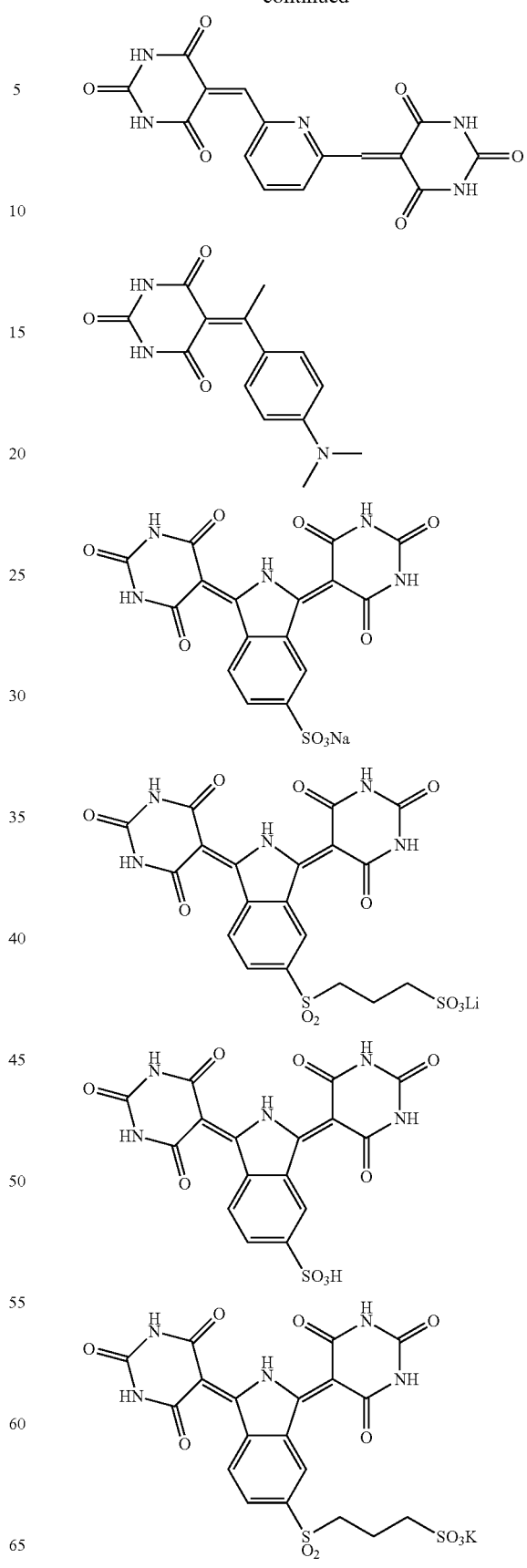

-continued

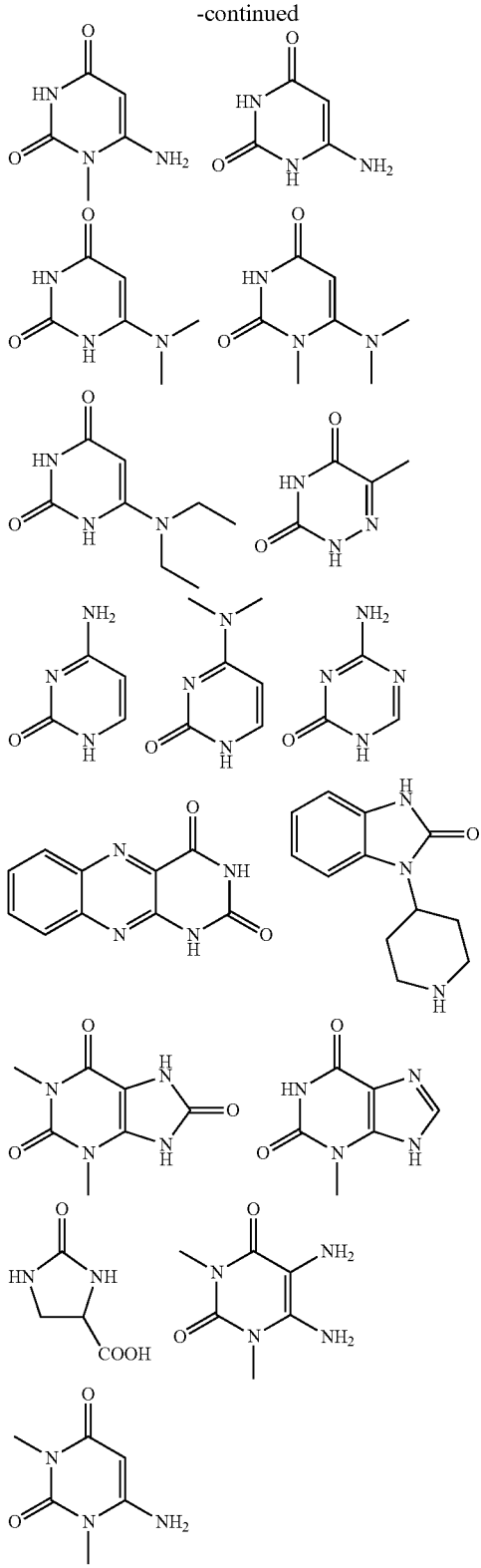

The (B) specified compound which can be used in the invention can be obtained by, for example, a method of allowing a barbituric derivative obtained by a reaction of a compound having a linear urea structure and malonic acid or a malonic ester to react with an aldehyde in water or an organic solvent; a method of allowing a compound having a linear urea structure to react with an alkylating agent; or a method of allowing barbituric acid or a derivative thereof to react with an aldehyde in water or an organic solvent. The (B) compound having a cyclic urea structure and having an acid group or a basic group according to the invention can be obtained by using a compound having an acid group or a basic group as a raw material for a compound having a linear urea structure, an aldehyde and an alkylating agent in each of the foregoing reactions, or by synthesizing a compound having a cyclic urea structure by each of the foregoing reactions and then introducing an acid group or a basic group thereinto. The (B) compound having a cyclic urea structure and having an acid group or a basic group according to the invention can also be synthesized by a method described in JP-A No. 1-34269 and is available as a commercial product, too.

In the invention, as to a preferred form of the (B) specified compound, a compound having a 6-membered urea structure is preferable from the viewpoint of dispersion stability, and a compound having a barbituric skeleton is more preferable.

The (B) compound having a cyclic urea structure and having an acid group or a basic group may be used singly or in combination of two or more kinds thereof in the pigment dispersion liquid.

The content of the (B) compound having a cyclic urea structure and having an acid group or a basic group is preferably from 0.1 to 30 parts by mass, more preferably from 0.5 to 20 parts by mass, and further preferably from 1 to 15 parts by mass based on 100 parts by mass of the (A) pigment as described later.

The content of the (B) compound having a cyclic urea structure and having an acid group or a basic group is preferably from 0.01 to 20% by mass, and more preferably from 0.05 to 10% by mass in the solid content of the pigment dispersion liquid of the invention.

<(A) Pigment>

The pigment to be used in the pigment dispersion liquid of the invention is not particularly limited, and conventionally known various pigments can be used singly or in admixture of two or more kinds thereof.

Above all, in view of interaction properties with the (B) compound having a cyclic urea structure and having an acid group or a basic group, (A-2) an organic pigment having an amide bond or a urea bond can be preferably used, and more specifically, an organic pigment having an imide group or a urea group is preferable.

In the invention, as the pigment capable of achieving excellent dispersibility when used in combination with the foregoing (B) specified compound, a pigment having a urea group or an imide group is preferable. From such a viewpoint, specific examples thereof include Pigment Yellow 120, Pigment Yellow 151, Pigment Yellow 154, Pigment Yellow 167, Pigment Yellow 175, Pigment Yellow 180, Pigment Yellow 182, Pigment Yellow 194, Pigment Orange 60, Pigment Orange 62, Pigment Orange 72, Pigment Red 123, Pigment Red 149, Pigment Red 171, Pigment Red 175, Pigment Red 176, Pigment Red 178, Pigment Red 179, Pigment Red 185, Pigment Red 190, Pigment Red 208, Pigment Violet 29, Pigment Violet 32, Pigment Blue 80, Pigment Brown 25, Pigment Black 31 and Pigment Black 32.

From the viewpoint of effects, (A-3) a pigment having a barbituric skeleton such as a barbituric group and a barbituric analog is more preferable. Specific examples thereof include Pigment Yellow 139, Pigment Yellow 150, Pigment Yellow 185, Pigment Orange 64, Pigment Orange 68, Pigment Orange 69 and Pigment Red 260.

The pigment dispersion liquid of the invention is useful for a curable composition for forming a colored pattern of a color filter as described later. When applying it to such a use, from the viewpoints of controlling color unevenness of the colored pattern to be formed and obtaining high contrast, a primary particle diameter of the pigment is preferably from 10 to 100 nm, more preferably from 10 to 70 nm, further preferably from 10 to 50 nm, and most preferably from 10 to 40 nm.

These organic pigments can be used singly, or can be used in combination for the purpose of increasing color purity.

The blending amount of the pigment to be used in the pigment dispersion liquid of the invention is properly determined depending upon the use purpose of the pigment dispersion liquid. In general, it is preferably in the range of from 5 to 80% by mass, and more preferably in the range of from 10 to 60% by mass in the solid content of the pigment dispersion liquid.

In the case where the pigment dispersion liquid of the invention is used for the curable composition for forming a colored pattern of a color filter as described later, the content of the pigment is preferably in the range of from 20 to 70% by mass, and more preferably in the range of from 25 to 65% by mass.

In the case where the pigment is used singly, the blending amount of the pigment as referred to herein is a blending amount of the pigment, and in the case where a combination of plural kinds of the pigment is blended, it is the whole amount thereof.

<(C) Dispersant>

For the purpose of securing the dispersion stability of the pigment by enhancing the compatibility with the solvent, the pigment dispersion liquid of the invention contains (C) a dispersant.

The dispersant (pigment dispersant) which can be used in the invention may be a high-molecular dispersant (dispersion resin) or a low-molecular weight compound.

Examples of the dispersant which can be favorably used in the invention include high-molecular dispersants (for example, polyamidoamines and salts thereof, polycarboxylic acids and salts thereof, high-molecular weight unsaturated acid esters, modified polyurethanes, modified polyesters, modified poly(meth)acrylates, (meth)acrylic copolymers and naphthalenesulfonic acid-formalin condensates), polyoxyethylene alkyl phosphates, polyoxyethylene alkylamines, alkanolamines and pigment derivatives.

The high-molecular dispersant can be further classified into a linear polymer, a terminal-modified polymer, a graft polymer and a block polymer in view of its structure.

The (C) dispersant such as a high-molecular dispersant acts so as to prevent re-aggregation or sedimentation of the pigment through direct adsorption on the surface of the pigment or adsorption on the (B) compound having a cyclic urea structure and having an acid group or a basic group, or adsorption on both of them. For that reason, as the high-molecular dispersant to be used in the invention, a terminal-modified polymer, a graft polymer and a block polymer, each having an anchor site onto the surface of the pigment, can be exemplified. A dispersant having an acid group or a basic group, which is able to form an interaction with the (B) specified compound, can also be used.

The pigment derivative is an embodiment of the dispersant, which has an effect of accelerating the adsorption of the high-molecular dispersant by modification of the pigment surface. Accordingly, it is also useful to use a pigment derivative having a skeleton which is the same as or analogous to the pigment to be used in combination with the high-molecular dispersant.

As the (C) pigment dispersant in the invention, commercially available products can be favorably used, such as DIS-PERBYK-101 (polyamidoamine phosphate), 107 (carboxylic acid ester), 110 (acid group-containing copolymer), 130 (polyamide), 161, 162, 163, 164, 165, 166 and 170 (high-molecular copolymers) and BYK-P104 and P105 (high-molecular weight unsaturated polycarboxylic acids), all of which are available from BYK Chemie; EFKA 4047, 4050, 4010 and 4165 (polyurethane types), EFKA 4330 and 4340 (block copolymers), 4400 and 4402 (modified polyacrylates), 5010 (polyester amide), 5765 (high-molecular weight polycarboxylic acid salt), 6220 (fatty acid polyester), 6745 (phthalocyanine derivative) and 6750 (azo pigment derivative), all of which are available from EFKA; AJISPER PB821 and PB822, all of which are available from Ajinomoto Fine-Techno Co., Inc.; FLOWLEN TG-710 (urethane oligomer) and POLYFLOW No. 50E and No. 300 (acrylic copolymers), all of which are available from Kyoeisha Chemical Co., Ltd.; DISPARLON KS-860, 873SN, 874 and #2150 (aliphatic polycarboxylic acids), #7004 (polyether ester), DA-703-50, DA-705 and DA-725, all of which are available from Kusumoto Chemicals, Ltd.; DEMOL RN and N (naphthalenesulfonic acid-formalin polycondensates), MS, C and SN-B (aromatic sulfonic acid-formalin polycondensates), HOMOGENOL L-18 (high-molecular polycarboxylic acid), EMULGEN 920, 930, 935 and 985 (polyoxyethylene nonyl phenyl ethers) and ACETAMIN 86 (stearylamine acetate), all of which are available from Kao Corporation; SOLSPERSE 5000 (phthalocyanine derivative), 22000 (azo pigment derivative), 13240 (polyester amine), 3000, 17000 and 27000 (polymers having a functional portion at the terminal thereof), 24000, 28000, 32000 and 38500 (graft polymers), all of which are available from the Lubrizol Corporation; and NIKKOL T106 (polyoxyethylene sorbitan monooleate) and MYS-IEX (polyoxyethylene monostearate), all of which are available from Nikko Chemicals Co., Ltd.

The (C) dispersant may be used singly or in combination of two or more kinds thereof. In the invention, it is especially preferable to use a combination of a pigment derivative and a high-molecular dispersant as the (C) dispersant.

The content of the (C) dispersant in the pigment dispersion liquid of the invention is preferably from 1 to 150 parts by mass, more preferably from 3 to 100 parts by mass, and further preferably from 5 to 80 parts by mass based on 100 parts by mass of the (A) pigment.

Specifically, when using a high-molecular dispersant, its use amount is preferably in the range of from 5 to 100 parts by mass, and more preferably in the range of from 10 to 80 parts by mass based on 100 parts by mass of the pigment. When using a pigment derivative, its use amount is preferably in the range of from 1 to 30 parts by mass, more preferably in the range of from 3 to 20 parts by mass, and especially preferably in the range of from 5 to 15 parts by mass based on 100 parts by mass of the pigment.

In the invention, in the case where the pigment dispersion liquid using a pigment as a coloring agent and a dispersant is applied to a colored curable composition as described later, from the viewpoints of curing sensitivity and color density, the total sum of the contents of the (A) pigment and the (C) dispersant is preferably 30% by mass to 90% by mass, more preferably 40% by mass to 85% by mass, and further preferably 50% by mass to 80% by mass relative to the whole of the solid content of the curable composition.

<(D) Solvent>

The pigment dispersion composition of the invention contains at least one (D) solvent. By using the (D) solvent together with the foregoing (A) pigment, (B) specified compound and (C) dispersant, a pigment dispersion composition having the pigment well dispersed therein can be prepared.

As the (D) solvent in the invention, a liquid selected from organic solvents described below is exemplified. The (D) solvent is chosen while taking into account solubility of each of the components to be contained in the pigment dispersion liquid and coating properties when applied to the curable composition. So far as these desired physical properties are satisfied, the (D) solvent is not particularly limited. However, it is preferably chosen while taking into account safety.

Specific examples of the solvent which is preferable include esters, for example, ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypoinate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxyl-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanate and ethyl 2-oxobutanate;

ethers, for example, diethylene glycol dimethyl ether, tetrahydrofuran, ethylene glycol monomethyl ether, ethylene glycol monoethyl ether, methyl cellosolve acetate (ethylene glycol monomethyl ether acetate), ethyl cellosolve acetate (ethylene glycol monoethyl ether acetate), diethylene glycol monomethyl ether, diethylene glycol monoethyl ether, diethylene glycol monobutyl ether, diethylene glycol monoethyl ether acetate, diethylene glycol monobutyl ether acetate, propylene glycol methyl ether, propylene glycol monomethyl ether acetate, propylene glycol ethyl ether acetate and propylene glycol propyl ether acetate;

ketones, for example, methyl ethyl ketone, cyclohexanone, 2-heptanone and 3-heptanone; and aromatic hydrocarbons, for example, toluene and xylene.

Of these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether and propylene glycol monomethyl ether acetate (PGMEA) are more preferable.

The content of the solvent in the pigment dispersion liquid of the invention is preferably from 10 to 98% by mass, more preferably from 30 to 95% by mass, and most preferably from 50 to 90% by mass. When the content of the solvent falls within the foregoing range, the pigment can be more uniformly dispersed, and such an embodiment is advantageous in view of dispersion stability after dispersion.

It is preferable that the pigment dispersion liquid of the invention is prepared through a mixing and dispersing step of mixing the (A) pigment, the (B) specified compound, the (C) dispersant and other optional components with the (D) solvent and mixing and dispersing them using a mixing machine or dispersion machine. Though the mixing and dispersing step is preferably composed of kneading dispersion and subsequent fine dispersion, the kneading dispersion can be omitted.

[Curable Composition]

The curable composition of the invention includes, in addition to a pigment dispersion liquid containing the foregoing (A) pigment, (B) specified compound, (C) dispersant and (D) solvent, (E) a radical polymerizable compound and (F) a photopolymerization initiator.

<(E) Radical Polymerizable Compound>

As a general radical polymerizable compound which can be used in the invention, compounds which are widely known in the industrial field as an ethylenically unsaturated double bond-containing compound can be used without particular limitations. These compounds have a chemical form, for example, a monomer, a prepolymer, namely a dimer, a trimer or an oligomer, and a mixture or copolymer thereof. Examples of the monomer and its copolymer include unsaturated carboxylic acids (for example, acrylic acid, methacrylic acid, itaconic acid, crotonic acid, isocrotonic acid and maleic acid) and esters or amides thereof. Of these, esters of an unsaturated carboxylic acid and an aliphatic polyhydric alcohol compound and amides of an unsaturated carboxylic acid and an aliphatic polyamine compound are preferably used. Addition reaction products of an unsaturated carboxylic acid ester or amide having a nucleophilic substituent (for example, a hydroxyl group, an amino group and a mercapto group) and a monofunctional or polyfunctional isocyanate or epoxy; dehydration condensation reaction products of such an unsaturated carboxylic acid ester or amide and a monofunctional or polyfunctional carboxylic acid; and the like are favorably used. Addition reaction products of an unsaturated carboxylic acid ester or amide having an electrophilic substituent (for example, an isocyanate group and an epoxy group) and a monofunctional or polyfunctional alcohol, amine or thiol; and displacement reaction products of an unsaturated carboxylic acid ester or amide having an elimination substituent (for example, a halogen group and a tosyloxy group) and a monofunctional or polyfunctional alcohol, amine or thiol are also favorable. Alternatively, compounds prepared in the same manner as above except that an unsaturated phosphonic acid, styrene, vinyl ether, etc. is used in place of the foregoing unsaturated carboxylic acid can also be used.

As to the monomer of an ester of an aliphatic polyhydric alcohol compound and an unsaturated carboxylic acid, specific examples of acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomers. EO-modified products or PO-modified products of these compounds are also exemplified.

Examples of methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)

phenyl]dimethylmethane. EO-modified products or PO-modified products of these compounds are also exemplified.

Examples of itaconic esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of crotonic esters include ethylene glycol dicrotonate, tetramethylene glycol dicrotonate, pentaerythritol dicrotonate and sorbitol tetradicrotonate. Examples of isocrotonic esters include ethylene glycol diisocrotonate, pentaerythritol diisocrotonate and sorbitol tetraisocrotonate. Examples of maleic esters include ethylene glycol dimaleate, triethylene glycol dimaleate, pentaerythritol dimaleate and sorbitol tetramaleate.

As examples of other esters, for example, aliphatic alcohol based esters described in JP-B No. 51-47334 and JP-A No. 57-196231; esters having an aromatic skeleton described in JP-A Nos. 59-5240, 59-5241 and 2-226149; and esters having an amino group described in JP-A No. 1-165613 are favorably used. Furthermore, the foregoing ester monomers can also be used as a mixture.

Specific examples of monomers of an amide of an aliphatic polyamine compound and an unsaturated carboxylic acid include methylene bisacrylamide, methylene bismethacrylamide, 1,6-hexamethylene bisacrylamide, 1,6-hexamethylene bismethacrylamide, diethylene triamine trisacrylamide, xylylene bisacrylamide and xylylene bismethacrylamide. As examples of other preferred amide based monomers, those having a cyclohexylene structure described in JP-B No. 54-21726 can be exemplified.

Urethane based addition polymerizable compounds produced through an addition reaction of an isocyanate and a hydroxyl group are also favorable. Specific examples thereof include vinyl urethane compounds containing two or more polymerizable vinyl groups in one molecule thereof, which are obtained by adding a hydroxyl group-containing vinyl monomer represented by the following formula (E) to a polyisocyanate compound having two or more isocyanate groups in one molecule thereof, as described in JP-B No. 48-41708.

$$CH_2=C(R^4)COOCH_2CH(R^5)OH \qquad (E)$$

In the foregoing formula (E), $R^4$ and $R^5$ each represent H or $CH_3$.

Urethane acrylates described in JP-A No. 51-37193 and JP-B Nos. 2-32293 and 2-16765; and urethane compounds having an ethylene oxide based skeleton described in JP-B Nos. 58-49860, 56-17654, 62-39417 and 62-39418 are also favorable. Furthermore, by using an addition polymerizable compound having an amino structure or a sulfide structure in a molecule thereof as described in JP-A Nos. 63-277653, 63-260909 and 1-105238, a curable composition which is very excellent in photocuring speed can be obtained.

As other examples, polyester acrylates described in JP-A No. 48-64183 and JP-B Nos. 49-43191 and 52-30490; and polyfunctional acrylates or methacrylates, such as epoxy (meth)acryrates obtained by a reaction of an epoxy resin and (meth)acrylic acid can be exemplified. Specified unsaturated compounds described in JP-B Nos. 46-43946, 1-40337 and 1-40336; and vinyl phosphonic acid based compounds described in JP-A No. 2-25493 can also be exemplified. In some cases, structures containing a perfluoroalkyl group described in JP-A-61-22048 are favorably used. Furthermore, compounds presented as photocurable monomers and oligomers in *Journal of the Adhesion Society of Japan*, Vol. 20, No. 7, pages 300 to 308 (1984) can be used.

In the invention, in the case where a radical polymerizable compound is added, from the viewpoint of curing sensitivity, it is preferable that two or more ethylenically unsaturated bonds are contained; and it is more preferable that three or more ethylenically unsaturated bonds are contained. Above all, it is preferable that two or more (meth)acrylic ester structures are contained; it is more preferable that three or more (meth)acrylic ester structures are contained; and it is the most preferable that four or more (meth)acrylic ester structures are contained. Furthermore, from the viewpoints of curing sensitivity and developability in an unexposed area, it is preferable that an EO-modified product is contained. From the viewpoints of curing sensitivity and strength in an exposed area, it is preferable that a urethane bond is contained.

From the foregoing viewpoints, there are preferably exemplified bisphenol A diacrylate, a bisphenol A diacrylate EO-modified product, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, a pentaerythritol tetraacrylate EO-modified product and a dipentaerythritol hexaacrylate EO-modified product. As commercially available products, urethane oligomers such as UAS-10 and UAB-140 (all of which are available from Sanyo-Kokusaku Pulp Co., Ltd.); DPHA-40H (available from Nippon Kayaku Co., Ltd.); and UA-306H, UA-306T, UA-306I, AH-600, T-600 and AI-600 (all of which are available from Kyoeisha Chemical Co., Ltd.) are preferable.

Of these, a bisphenol A diacrylate EO-modified product, pentaerythritol triacrylate, pentaerythritol tetraacrylate, dipentaerythritol pentaacrylate, dipentaerythritol hexaacrylate, tri(acryloyloxyethyl)isocyanurate, a pentaerythritol tetraacrylate EO-modified product and a dipentaerythritol hexaacrylate EO-modified product; and DPHA-40H (available from Nippon Kayaku Co., Ltd.) and UA-306H, UA-306T, UA-306I, AH-600, T-600 and AI-600 (all of which are available from Kyoeisha Chemical Co., Ltd.) as commercially available products are more preferable.

The content of the (E) radical polymerizable compound in the curable composition of the invention is preferably from 1 to 90% by mass, more preferably from 5 to 80% by mass, and further preferably from 10 to 70% by mass relative to the whole of the solid content of the curable composition.

In particular, in the case where the curable composition of the invention is used for the formation of a colored pattern of a color filter, in view of further improving photosensitivity, adhesion to a support and degree of curing, the content of the (E) radical polymerizable compound is preferably from 5 to 50% by mass, more preferably from 7 to 40% by mass, and further preferably from 10 to 35% by mass relative to the whole of the solid content of the curable composition of the invention.

<(F) Photopolymerization Initiator>

The curable composition of the invention contains a photopolymerization initiator.

The photopolymerization initiator in the invention is a compound capable of initiating and accelerating polymerization of the foregoing (E) radical polymerizable compound upon decomposition with light and preferably has absorption in a wavelength region of from 300 to 500 nm. The photopolymerization initiator can be used singly or in combination of two or more kinds thereof.

Examples of the photopolymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaaryl biimidazole compounds, organic boric acid compounds, disulfonic acid compounds, oxime ester compounds, onium salt compounds and acyl phosphine (oxide) compounds.

As the organic halogenated compounds, there are specifically exemplified compounds described in Wakabayashi, et al., *Bull Chem. Soc. Japan*, Vol. 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339 and M. P. Hutt, *Journal of Heterocyclic Chemistry*, Vol. 1 (No. 3), 1970; and especially oxazole compounds and s-triazine compounds having a trihalomethyl group substituted thereon.

As the s-triazine compounds, there are more favorably exemplified s-triazine derivatives in which at least one mono-, di- or trihalogen-substituted methyl group is bound to an s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the oxydiazole compound include 2-trichloromethyl-5-styryl-1,3,4-oxydiazole, 2-trichloromethyl-5-(cyanostyryl)-1,3,4-oxydiazole, 2-trichloromethyl-5-(naphth-1-yl)-1,3,4-oxydiazole and 2-trichloromethyl-5-(4-styryl)styryl-1,3,4-oxydiazole.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl)ketone and 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic ester derivatives such as ethyl p-dimethylaminobenzoate and ethyl p-diethylaminobenzoate.

Examples of the ketal compound include benzyl methyl ketal and benzyl-β-methoxyethyl ethyl acetal.

Examples of the benzoin compound include m-benzoin isopropyl ether, benzoin isobutyl ether, benzoin methyl ether and methyl o-benzoyl benzoate.

Examples of the acridine compound include 9-phenylacridine and 1,7-bis(9-acridinyl)heptanes.

Examples of the organic peroxide compound include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(t-butylperoxycarbonyl)benzophenone, 3,3',4,4'-tetra(t-hexylperoxycarbonyl)benzophenone, 3,3',4,4'-tetra(p-isopropylcumylperoxycarbonyl)benzophenone, carbonyl di(t-butylperoxydihydrogendiphthalate), and carbonyl di(t-hexylperoxydihydrogendiphthalate).

Examples of the azo compound include azo compounds described in JP-A No. 8-108621.

Examples of the coumarin compound include 3-methyl-5-amino((s-triazin-2-yl)amino)-3-phenylcoumarin, 3-chloro-5-diethylamino((s-triazin-2-yl)amino)-3-phenylcoumarin and 3-butyl-5-dimethylamino ((s-triazin-2-yl)amino)-3-phenylcoumarin.

Examples of the azide compound include organic azide compounds described in U.S. Pat. Nos. 2,848,328, 2,852,379 and 2,940,853 and 2,6-bis(4-azidobenzylidene)-4-ethylcyclohexanone (BAC-E).

Examples of the metallocene compound include various titanocene compounds described in JP-A Nos. 59-152396, 61-151197, 63-41484, 2-249, 2-4705 and 5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-terafluorophen-1-yl, dimethylcyclopentadienyl-Ti-bis-2,3,4,5,6-pentafluorophen-1-yl, and iron-allene complexes described in JP-A Nos. 1-304453 and 1-152109.

As the biimidazole compound, for example, hexaaryl biimidazole compounds (lophine dimer compounds) are preferable.

Examples of the hexaaryl biimidazole compound include lophine dimers described in JP-B Nos. 45-37377 and 44-86516; and various compounds described in JP-B No. 6-29285 and U.S. Pat. Nos. 3,479,185, 4,311,783 and 4,622,286, specific examples of which include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'- tetraphenyl biimidazole, 2,2'-bis(o-methylphenyl)-4,4',5,5'-tetraphenyl biimidazole and 2,2'-bis(o-trifluorophenyl)-4,4',5,5'-tetraphenyl biimidazole.

Specific examples of the organic boric acid salt compound include organic boric acid salts described in JP-A No. 62-143044, 62-150242, 9-188685, 9-188686, 9-188710, 2000-131837 and 2002-107916, Japanese Patent No. 2764769, Japanese Patent Application No. 2000-310808 and Kunz and Martin, *Red Tech '98. Proceeding, April*, pages 19 to 22 (1998), Chicago; organoboron sulfonium complexes or organoboron oxosulfonium complexes described in JP-A Nos. 6-157623, 6-175564 and 6-175561; organoboron iodonium complexes described in JP-A Nos. 6-175554 and 6-175553; organoboron phosphonium complexes described in JP-A No. 9-188710; and organoboron transition metal coordination complexes described in JP-A Nos. 6-348011, 7-128785, 7-140589, 7-306527 and 7-292014.

Examples of the disulfone compound include compounds described in JP-A No. 61-166544 and Japanese Patent Application No. 2001-132318.

Examples of the oxime ester compound include compounds described in *J. C. S. Perkin II*, 1653 to 1660 (1979), *J. C. S. Perkin II*, 156 to 162 (1979), *Journal of Photopolymer Science and Technology*, 202 to 232 (1995), JP-A Nos. 2000-66385 and 2000-80068 and JP-W No. 2004-534797.

Examples of the onium salt compound include diazonium salts described in S. I. Schlesinger, *Photogr. Sci. Eng.*, 18, 387 (1974) and T. S. Bal, et al., *Polymer*, 21, 423 (1980); ammonium salts described in U.S. Pat. No. 4,069,055 and JP-A No. 4-365049; phosphonium salts described in U.S. Pat. Nos. 4,069,055 and 4,069,056; and iodonium salts described in European Patent No. 104,143, U.S. Pat. Nos. 339,049 and 410,201 and JP-A Nos. 2-150848 and 2-296514.

The iodonium salt which can be favorably used in the invention is a diaryl iodonium salt; and from the viewpoint of stability, it is preferably substituted with two or more electron donating groups such as an alkyl group, an alkoxy group and an aryloxy group. As other preferred form of the sulfonium salt, iodonium salts in which one substituent of a triaryl sulfonium salt has a coumarin or anthraquinone structure and which has absorption at 300 nm or more are preferable.

Examples of the sulfonium salt which can be favorably used in the invention include sulfonium salts described in European Patents Nos. 370,693, 390,214, 233,567, 297,443 and 297,442, U.S. Pat. Nos. 4,933,377, 161,811, 410,201, 339,049, 4,760,013, 4,734,444 and 2,833,827 and German Patents Nos. 2,904,626, 3,604,580 and 3,604,581. From the viewpoint of stability, those substituted with an electron withdrawing group are preferable. It is preferable that a Hammett's value of the electron withdrawing group is larger than 0. Preferred examples of the electron withdrawing group include a halogen atom and a carboxyl group.

Examples of other preferred sulfonium salt include iodonium salts in which one substituent of a triaryl sulfonium salt has a coumarin or anthraquinone structure and which has absorption at 300 nm or more. Examples of another preferred sulfonium salt include sulfonium salts in which a triaryl sulfonium salt has an aryloxy group or an aryl thio group as a substituent and which has absorption at 300 nm or more.

Examples of the onium salt compound include selenonium salts described in J. V. Crivello, et al., *Macromolecules*, 10(6), 1307 (1977) and J. V. Crivello, et al., *J. Polymer Sci.*, Polymer Chem. Ed., 17, 1047 (1979); and arsonium salts described in C. S. Wen, et al., *Teh. Proc. Conf. Rad. Curing ASIA*, page 478, Tokyo, October (1988).

Examples of the acyl phosphine (oxide) compound include IRGACURE 819, DAROCURE 4265 and DAROCURE TPO, all of which are available from Ciba Specialty Chemicals.

From the viewpoint of exposure sensitivity, the (F) photopolymerization initiator to be used in the invention is preferably a compound selected from the group consisting of trihalomethyl triazine based compounds, benzyl dimethyl ketal compounds, α-hydroxyketone compounds, α-aminoketone compounds, acyl phosphine based compounds, phosphine oxide based compounds, metallocene compounds, oxime based compounds, a triallyl imidazole dimer, onium based compounds, benzothiazole based compounds, benzophenone based compounds, acetophenone based compounds and derivatives thereof, cyclopentadiene-benzene-iron complexes and salts thereof, halomethyl oxadiazole compounds and 3-aryl-substituted coumarin compounds.

Of these, at least one compound selected from the group consisting of trihalomethyl triazine based compounds, α-aminoketone compounds, acyl phosphine based compounds, phosphine oxide based compounds, oxime based compounds, a triallyl imidazole dimer, onium based compounds, benzophenone based compounds and acetophenone based compounds is more preferable; and at least one compound selected from the group consisting of trihalomethyl triazine based compounds, α-aminoketone compounds, oxime based compounds, a triallyl imidazole dimer and benzophenone based compounds is the most preferable.

In particular, in the case where the curable composition of the invention is used for the preparation of a solid state imaging device with a color filter, since it is necessary to form fine pixels in a sharp shape, it is important not only to be cured but also to be developed at a fine unexposed area without residue. From such a viewpoint, triazine based compounds, lophine dimer based compounds and oxime based compounds are especially preferable. In particular, in the solid state imaging device, when fine pixels are formed, a stepper exposure is employed for the exposure for curing. However, this exposure machine may be damaged by a halogen, and the addition amount of the photopolymerization initiator should be controlled at a low level. Therefore, taking into account these points, it may be said that in order to form a fine colored pattern such as in a solid state imaging device, the use of an oxime based compound as the (F) photopolymerization initiator is the most preferable.

The content of the (F) photopolymerization initiator to be contained in the curable composition of the invention is preferably from 0.1 to 50% by mass, more preferably from 0.5 to 30% by mass, and especially preferably from 1 to 20% by mass relative to the whole of the solid content of the curable composition. When the content of the (F) photopolymerization initiator falls within the foregoing range, satisfactory sensitivity and pattern forming properties are obtainable.

<Binder Polymer>

In addition to these essential components, for the purposes of improving a film characteristic, adjusting developability and the like, a binder polymer can be further used in the curable composition of the invention, if desired. It is preferable to use a linear organic polymer as the binder. As such a "linear organic polymer", known materials can be arbitrarily used. In order to make it possible to achieve development with water or development with a weakly alkaline aqueous solution, a linear organic polymer which is soluble or swellable in water or a weakly alkaline aqueous solution is preferably chosen. The linear organic polymer is chosen and used in view of not only a use as a film forming agent but a use as water, a weakly alkaline aqueous solution or an organic solvent developer. For example, when a water-soluble organic polymer is used, development with water becomes possible. Examples of such a linear organic polymer include radical polymers having a carboxyl group at the side chain thereof, for example, polymers described in JP-A No. 59-44615, JP-B Nos. 54-34327, 58-12577 and 54-25957 and JP-A Nos. 54-92723, 59-53836 and 59-71048, namely resins obtained by homopolymerizing or copolymerizing a carboxyl group-containing monomer; resins obtained by homopolymerizing or copolymerizing an acid anhydride-containing monomer and hydrolyzing, half-esterifying or half-amidating an acid anhydride unit; and epoxy acrylates obtained by modifying an epoxy resin with an unsaturated monocarboxylic acid and an acid anhydride. Examples of the carboxyl group-containing monomer include acrylic acid, methacrylic acid, itaconic acid, crotonic acid, maleic acid, fumaric acid and 4-carboxylstyrene. Examples of the acid anhydride-containing monomer include maleic anhydride.

Similarly, there are exemplified acidic cellulose derivatives having a carboxyl group at a side chain thereof. Besides, polymers obtained by adding a cyclic acid anhydride to a hydroxyl group-containing polymer are useful.

In the case where an alkali-soluble resin is used as the copolymer, monomers other than the above-exemplified monomers can be used as a compound to be copolymerized. Examples of other monomers include the following compounds (1) to (13).

(1) Aliphatic hydroxyl group-containing acrylic esters and methacrylic esters, for example, 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates, for example, methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate.

(3) Alkyl methacrylates, for example, methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate.

(4) Acrylamides and methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide and allylmethacrylamide.

(5) Vinyl ethers, for example, ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters, for example, vinyl acetate, vinyl chloroacetate, vinyl butyrate and vinyl benzoate.

(7) Styrenes, for example, styrene, α-methylstyrene, methylstyrene, chloromethylstyrene and p-acetoxystyrene.

(8) Vinyl ketones, for example, methyl vinyl ketone, ethyl vinyl ketone, propyl vinyl ketone and phenyl vinyl ketone.

(9) Olefins, for example, ethylene, propylene, isobutylene, butadiene and isoprene.

(10) N-Vinylpyrrolidone, acrylonitrile, methacrylonitrile, etc.

(11) Unsaturated imides, for example, maleimide, N-acryloylacrylamide, N-acetylmethacrylamide, N-propionylmethacrylamide and N-(p-chlorobenzoyl)methacrylamide.

(12) Methacrylic acid based monomers having a hetero atom bound at the α-position, for example, compounds described in Japanese Patent Applications Nos. 2001-115595 and 2001-115598.

Of these, (meth)acrylic resins having an allyl group or a vinyl ester group and a carboxyl group at a side chain thereof; alkali-soluble resins having a double bond at a side chain thereof as described in JP-A Nos. 2000-187322 and 2002-62698; and alkali-soluble resins having an amide group at a side chain thereof as described in JP-A No. 2001-242612 are favorable because they are excellent in balance between film strength, sensitivity and developability.

Acid group-containing urethane based binder polymers described in JP-B Nos. 7-120040, 7-120041, 7-120042 and 8-12424, JP-A Nos. 63-287944, 63-287947 and 1-271741 and Japanese Patent Application No. 10-116232; and urethane based binder polymers having an acid group and a double bond at a side chain thereof as described in JP-A No. 2002-107918 are advantageous in view of printing resistance and low-exposure suitability because they are very excellent in strength.

Acid group-containing acetal-modified polyvinyl alcohol based binder polymers described in European Patents Nos. 993,966 and 1,204,000 and JP-A No. 2001-318463 are favorable because they are excellent in balance between film strength and developability.

Furthermore, as other water-soluble linear organic polymers, polyvinylpyrrolidone, polyethylene oxide and the like are useful. In order to increase the strength of a cured film, alcohol-soluble nylons, a polyether of 2,2-bis(4-hydroxyphenyl)propane and epichlorohydrin and the like are also useful.

A weight average molecular weight of the binder polymer which can be used in the invention is preferably 3,000 or more, and more preferably in the range of from 5,000 to 300,000; and a number average molecular weight is preferably 1,000 or more, and more preferably in the range of from 2,000 to 250,000. A polydispersity {(weight average molecular weight)/(number average molecular weight)} is preferably 1 or more, and more preferably in the range of from 1.1 to 10.

These binder polymers may be any of a random polymer, a block polymer, a graft polymer, etc.

The binder polymer which can be used in the invention can be synthesized by a conventionally known method. Examples of a solvent which can be used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents are used singly or in admixture of two or more kinds thereof.

Examples of a radical polymerization initiator to be used in synthesizing the binder polymer which can be used include known compounds such as azo based initiators and peroxide initiators.

The binder polymer may be added at the time of dispersing a pigment, or may be added at the time of preparing the curable composition by using a dispersion liquid thereof. It is favorable that the binder polymer is preferably added in an amount of from 0% by weight to 50% by weight, and more preferably from 2% by weight to 30% by weight in the whole of the solid content at the time of preparing the curable composition.

In the invention, in the case where the binder polymer is used in the image formation by alkaline development in a color filter for liquid crystal or solid state imaging device, it is preferable that the binder polymer has an acid group and/or a hydrophilic group. Preferred examples of the acid group include a carboxyl group, a sulfonamide group, a sulfonic acid group, a phosphonic acid group and a phenol group. From the viewpoints of developability and sensitivity, an acid value is preferably from 0.1 mmoles/g to 10 mmoles/g, more preferably from 0.2 mmoles/g to 5 mmoles/g, and most preferably from 0.3 mmoles/g to 3 mmoles/g.

As the hydrophilic group as referred to herein, metal salts of the foregoing acid groups; salts of an organic cation such as ammonium, phosphonium, sulfonium and iodonium; ammonium salts; and those having a hydroxyl group or an alkylene oxide group are preferable.

<Adhesive Group-Containing Compound>

In the case where the curable composition of the invention is used for forming a colored pattern of a color filter, for the purpose of improving adhesion to a substrate, an adhesive group-containing compound capable of improving adhesion to a substrate is preferably used therein.

The adhesive group as referred to in the invention can be used so far as it has adhesion to a substrate to be used for a color filter. A compound having adsorption properties to a glass substrate or a silicon substrate is especially preferable.

The adhesive group which such a compound has is preferably a group selected from acid groups such as a sulfonic acid group, a phosphonic acid group and a carboxyl group; ester groups of these acids; metal salts of these acids; onium salts of these metals; onium groups such as an ammonium group and a pyridinium group; substituents capable of generating a silanol group upon hydrolysis such as an alkoxysilyl group; ampholytic ionic groups such as a phenolic hydroxyl group and an N-oxide group; and chelating groups such as an imino diacetic acid.

From the viewpoint of adhesion, an alkoxysilyl group and/or a hydrolyzed group thereof is preferable.

<Other Additives>

In the invention, optionally, it is possible to use a compound having a group capable of improving developability, or a group capable of improving sensitivity such as a carbon-carbon double bond containing group or a cyclic alkoxy group. Also, a group having such a function can be employed by introducing it to another component.

As the group capable of improving developability, a hetero atom-containing functional group is preferable, examples of which include an alkoxy group, an alkoxycarbonyl group, a carboxyl group, a hydroxyl group, an amino group, a urethane group, an amide group, a thiol group, a sulfo group and a urea group.

Preferred examples of the group capable of improving sensitivity include a methacryl group, an acryl group, a styryl group, a vinyl ether group, an allyl group, a cyclic alkenyl group, a furyl group, an oxetane group, an epoxy group, a tetrahydrofuran group. From the viewpoint of sensitivity, a methacryl group, an acryl group and a styryl group are preferable.

<Sensitizer>

For the purposes of improving radical generation efficiency of a radical initiator and making the sensitive wavelength long, the curable composition of the invention may contain a sensitizer. The sensitizer which can be used in the invention is preferably one capable of achieving sensitization of the foregoing photopolymerization initiator through an electron transfer mechanism or an energy transfer mechanism.

Examples of the sensitizer which can be used in the invention include those belonging to the compounds as exemplified below and having an absorption wavelength in a wavelength region of from 300 nm to 450 nm, preferably from 330 nm to 450 nm.

Examples thereof include polynuclear aromatic compounds (for example, phenanthrene, anthracene, pyrene, perylene, triphenylene and 9,10-dialkoxyanthracenes), xanthenes (for example, Fluororescein, Eosine, Erythrocin, Rhodamine B and Rose Bengale), thioxanthones (for example, isopropylthioxanthone, diethylthioxanthone and chlorothioxanothone), cyanines (for example, Thiacarbocyanine and Oxacarbocyanine), merocyanines (for example, merocyanine and carbomerocyanine), phthalocyanines, thiazines (for example, Thionine, Methylene Blue and Toluidine Blue), acridines (for example, Acridine Orange, chloroflavin and acriflavin), anthraquinones (for example, anthraquinone), squaryliums (for example, squarylium), Acridine Orange, coumarins (for example, 7-diethylamino-4-methylcoumarin), keto-coumarin, phenothiazines, phenazines, styrylbenzenes, azo compounds, diphenylmethane, triphenylmethane, distyrylbenzens, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds (for example, acetophenone, benzophenone, thioxanthone and Michler's ketone) and heterocyclic compounds (for example, N-aryloxazolidinones). Furthermore, there are exemplified compounds described in European Patent No. 568,993, U.S. Pat. Nos. 4,508,811 and 5,227,227 and JP-A Nos. 2001-125255 and 11-271969.

More preferred examples of the sensitizer include compounds represented by the following formulae (i) to (iv).

(i)

In the formula (i), $A^1$ represents a sulfur atom or $NR^{50}$; $R^{50}$ represents an alkyl group or an aryl group; $L^2$ represents a non-metal atomic group which forms, together with adjacent $A^1$ and the adjacent carbon atom, a basic nucleus of a dye; $R^{51}$ and $R^{52}$ each independently represent a hydrogen atom or a monovalent non-metal atomic group, and $R^{51}$ and $R^{52}$ may be linked to each other to form an acid nucleus of a dye; and W represents an oxygen atom or a sulfur atom.

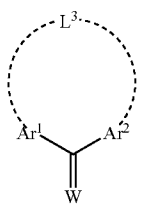

(ii)

In the formula (ii), $Ar^1$ and $Ar^2$ each independently represent an aryl group and are linked to each other via -$L^3$-; $L^3$ represents —O— or —S—; and W is synonymous with that in the formula (i).

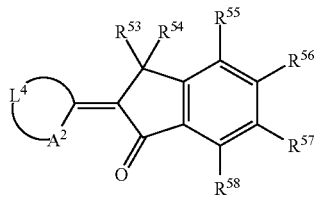

(iii)

In the formula (iii), $A^2$ represents a sulfur atom or $NR^{59}$; $L^4$ represents a non-metal atomic group which forms, together with adjacent $A^2$ and the adjacent carbon atom, a basic nucleus of a dye; $R^{53}$, $R^{54}$, $R^{55}$, $R^{56}$, $R^{57}$ and $R^{58}$ each independently represent a monovalent non-metal atomic group; and $R^{59}$ represents an alkyl group or an aryl group.

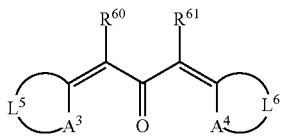

(iv)

In the formula (iv), $A^3$ and $A^4$ each represent —S—, —$NR^{62}$— or —$NR^{63}$—; $R^{62}$ and $R^{63}$ each independently represent a substituted or unsubstituted alkyl group or a substituted or unsubstituted aryl group; $L^5$ and $L^6$ each independently represent a non-metal atomic group which forms, together with adjacent $A^3$ or $A^4$ and the adjacent carbon atom, a basic nucleus of a dye; and $R^{60}$ and $R^{61}$ each independently represent a monovalent non-metal atomic group or are able to be linked to each other to form an aliphatic or aromatic ring.

Preferred specific examples of the compounds represented by the formulae (i) to (iv) are given below.

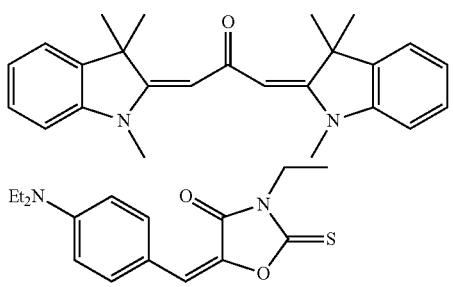

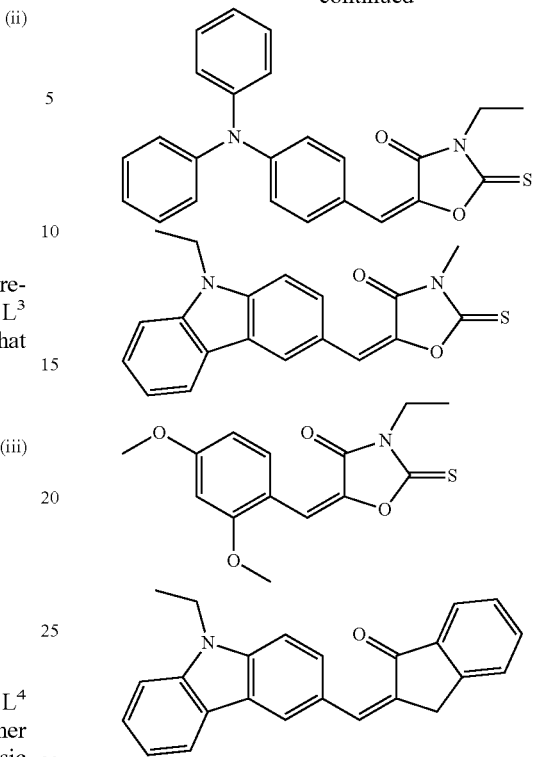

The sensitizer may be used singly or in combination of two or more kinds thereof.

From the viewpoints of light absorption efficiency in the depth and initiation and decomposition efficiency, the content of the sensitizer in the curable composition of the invention is preferably from 0.1 to 20% by mass, and more preferably from 0.5 to 15% by mass as a solid content.

<Cosensitizer>

It is also preferable that the curable composition of the invention contains a cosensitizer. In the invention, the cosensitizer has an action to more improve sensitivity to active radiations of a sensitizing dye or an initiator or to control polymerization inhibition of a polymerizable compound due to oxygen.

Examples of such a cosensitizer include amines, for example, compounds described in M. R. Sander, et al., *Journal of Polymer Society*, Vol. 10, page 3173 (1972), JP-B No. 44-20189, JP-A Nos. 51-82102, 52-134692, 59-138205, 60-84305, 62-18537 and 64-33104 and *Research Disclosure*, No. 33825. Specific examples thereof include triethanolamine, ethyl p-dimethylaminobenzoate, p-formyldimethylaniline and p-methylthiodimethylaniline.

As other examples of the cosensitizer, there are enumerated thiols and sulfides, for example, thiol compounds described in JP-A No. 53-702, JP-B No. 55-500806 and JP-A No. 5-142772 and disulfide compounds described in JP-A No. 56-75643. Specific examples thereof include 2-mercaptobenzothiazole, 2-mercaptobenzoxazole, 2-mercaptobenzimidazole, 2-mercapto-4(3H)-quinazoline and β-mercaptonaphthalene.

As other examples of the cosensitizer, there are enumerated amino acid compounds (for example, N-phenylglycine), organometallic compounds described in JP-B No. 48-42965 (for example, tributyltin acetate), hydrogen donators described in JP-B No. 55-34414 and sulfur compounds described in JP-A No. 6-308727 (for example, trithiane).

From the viewpoint of improving the curing speed due to a balance between polymerization growth speed and chain transfer, the content of such a cosensitizer is preferably in the range of from 0.1 to 30% by mass, more preferably in the range of from 1 to 25% by mass, and further preferably in the range of from 0.5 to 20% by mass relative to the mass of the whole of the solid of the curable composition.

<Polymerization Inhibitor>

In the invention, in order to prevent unnecessary heat polymerization of a polymerizable, ethylenically unsaturated double bond-containing compound during the manufacture or preservation of the curable composition, it is desirable to add a small amount of a heat polymerization inhibitor.

Examples of the heat polymerization inhibitor which can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and cerous N-nitrosophenylhydroxyamine.

The addition amount of the heat polymerization inhibitor is preferably from about 0.01% by mass to about 5% by mass relative to the mass of the whole composition. For the purpose of preventing polymerization inhibition due to oxygen, a higher fatty acid derivative such as behenic acid and behenic amide or the like may be added and distributed on the surface of a photosensitive layer during a step of drying after coating as the need arises. The addition amount of the higher fatty acid derivative is preferably from about 0.5% by mass to about 10% by mass of the whole composition.

<Other Additives>

Furthermore, in the invention, known additives such as inorganic fillers for improving physical properties of a cured film, plasticizers and lipophilicity agents capable of improving inking properties on the surface of a photosensitive layer may be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. When a binder is used, the plasticizer can be added in an amount of not more than 10% by mass relative to the total mass of the ethylenically unsaturated double bond-containing compound and the binder.

The foregoing curable composition of the invention is cured at a high sensitivity and is satisfactory in storage stability. The curable composition of the invention exhibits high adhesion to the surface of a hard material such as a substrate, to which the curable composition is applied. Accordingly, the curable composition of the invention can be favorably used in the fields of stereolithography, holography, image forming materials inclusive of a color filter, inks, paints, adhesives, coating agents and the like.

[Color Filter]

The color filter of the invention having a colored pattern formed by the curable composition of the invention is hereunder described along with its manufacturing method.

The color filter of the invention comprises a support having thereon a colored pattern formed using the curable composition of the invention.

The color filter of the invention is hereunder described in detail through its manufacturing method.

The manufacturing method of the color filter of the invention comprises the steps of coating the curable composition of the invention on a support to form a curable composition layer (hereinafter properly abbreviated as "curable composition layer forming step"); exposing the curable composition layer through a mask (hereinafter properly abbreviated as "exposure step"); and developing the exposed curable composition layer to form a colored pattern (hereinafter properly abbreviated as "development step").

The respective steps in the manufacturing method of the invention are hereunder described.

<Curable Composition Layer Forming Step>

In the curable composition layer forming step, the curable composition of the invention is coated on a support to form a curable composition layer.

Examples of the support which can be used in this step include supports to be used for liquid crystal display devices and the like, for example, soda-lime glass, PYREX™ glass, quartz glass and glass obtained by depositing a transparent conductive film on such glass; photoelectric conversion device substrates to be used for imaging devices and the like, for example, silicon substrates; and complementary metal oxide semiconductors (CMOS). On these substrates, there may be the case where black stripes for isolating respective pixels are formed.

An undercoat layer may be provided on such a support for the purpose of improving adhesiveness to an upper layer, preventing diffusion of substances or flattening the surface of the substrate as the need arises.

As a coating method of the curable composition of the invention on the support, various coating methods such as slit coating, an inkjet method, rotary coating, cast coating, roll coating and a screen printing method can be applied.

The thickness of the coating film of the curable composition is preferably from 0.1 to 10 μm, more preferably from 0.2 to 5 μm, and further preferably from 0.2 to 3 μm.

Drying (pre-baking) of the photocurable composition layer coated on the substrate can be carried out at a temperature of from 50° C. to 140° C. for from 10 to 300 seconds by using a hot plate, an oven, etc.

<Exposure Step>

In the exposure step, the curable composition layer formed in the foregoing curable composition layer forming step is exposed through a mask having a prescribed mask pattern.

As to the exposure in this step, the pattern exposure of the coating film can be carried out by exposing the curable composition layer through a prescribed mask pattern to cure only a light exposed coating film and developing it with a developing solution to form a pattern-shaped film composed of pixels of respective colors (three colors or four colors). As radiations which can be used for the exposure, in particular, ultraviolet rays such as g-line and i-line can be preferably used. The irradiation dose is preferably from 5 to 1,500 mJ/cm$^2$, more preferably 10 to 1,000 mJ/cm$^2$, and most preferably from 10 to 500 mJ/cm$^2$.

In the case where the color filter of the invention is used for a liquid crystal display device, the irradiation dose falling within the foregoing range is preferably from 5 to 200 mJ/cm$^2$, more preferably from 10 to 150 mJ/cm$^2$, and most preferably from 10 to 100 mJ/cm$^2$. In the case where the color filter of the invention is used for a solid state imaging device, the irradiation dose falling within the foregoing range is preferably from 30 to 1,500 mJ/cm$^2$, more preferably from 50 to 1,000 mJ/cm$^2$, and most preferably from 80 to 500 mJ/cm$^2$.

<Development Step>

Next, by carrying out an alkaline development treatment, an unexposed area by the exposure is eluted into an alkaline aqueous solution, whereby only a photo-cured area remains. As the developing solution, an organic alkaline developing solution which does not damage a circuit of the substrate is desirable. The development temperature is usually from 20° C. to 30° C., and the development time is from 20 to 90 seconds.

Examples of an alkaline agent which is used for the developing solution include ammonia water and organic alkaline compounds such as ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene. An alkaline aqueous solution prepared by diluting such an alkaline agent with pure water so as to have a concentration of from 0.001 to 10% by mass, and preferably from 0.01 to 1% by mass is preferably used as the developing solution. In the case where a developing solution composed of such an alkaline aqueous solution is used, in general, rinsing with pure water is carried out after the development. An aqueous solution containing an inorganic alkaline compound such as sodium hydroxide, potassium hydroxide, potassium carbonate, potassium hydrogencarbonate, sodium carbonate, sodium hydrogencarbonate and calcium hydroxide can also be used.

Next, the excessive developing solution is rinsed and removed, and after drying, a heating treatment (post-baking) is carried out. By successively repeating the foregoing step for every color in this way, a cured film can be manufactured.

There is thus obtained a color filter.

The post-baking is a heating treatment to be carried out after the development for the purpose of making the curing complete. The heat curing treatment is usually carried out at from 100° C. to 240° C. In the case where the substrate is a glass substrate or a silicon substrate, it is preferable that the heat treatment is carried out at from 200° C. to 240° C. within the foregoing temperature range.

This post-baking treatment can be carried out continuously or batchwise on the coating film after the development by using a heater such as a hot plate, a convection oven (hot air circulating oven) and a high-frequency heater under the foregoing condition.

After the foregoing curable composition layer forming step, exposure step and development step, the manufacturing method of the invention may include a curing step of curing the formed colored pattern upon heating and/or exposure, if desired.

By repeating the above-described curable composition layer forming step, exposure step and development step (and further the curing step, if desired) for the desired hue number, a color filter composed of desired hues is prepared.

As to applications of the curable composition of the invention, the use for pixels of a color filter has been chiefly described. Needless to say, the curable composition of the invention is also applicable to a black matrix to be provided between pixels of a color filter. Except for the addition of a black coloring agent such as carbon black and titanium black as a coloring agent to the curable composition of the invention, similar to the foregoing preparation method of pixels, the black matrix can be formed by pattern exposure, alkaline development and further post-baking to accelerate curing of the film.

Since the color filter of the invention is prepared using the foregoing curable composition of the invention, the formed colored pattern exhibits high adhesion to the support substrate, and the cured composition is excellent in development resistance. Therefore, a pattern with high resolution, which is excellent in exposure sensitivity and satisfactory in adhesion to the substrate in an exposed area and is able to give a desired cross-sectional shape, can be formed. Accordingly, the color filter of the invention can be favorably used for liquid crystal display devices and solid state imaging devices such as CCD and is especially favorable for high-resolution CCD devices or CMOS devices with more than 1,000,000 pixels. The color filter of the invention can be used as a color filter to be disposed between a light-receiving part of each of pixels and a microlens for gathering light in CCD.

It is thought that since the pigment dispersion liquid of the present invention contains a compound having a cyclic urea structure and having an acid group or a basic group, and this compound is adsorbed on the surface of an organic pigment due to the cyclic urea structure thereof to effectively prevent aggregation of the pigment, excellent dispersion stability of pigment with time is achieved.

Also, it is considered that since in the pigment dispersion liquid of the invention, the specified compound is adsorbed on the surface of the pigment and stably dispersed, and the acid group or basic group in the foregoing compound forms an interaction with the coexisting dispersant, excellent dispersion stability is obtained even by the addition of a small amount of a dispersion resin; and that in the curable composition of the invention containing the foregoing pigment dispersion liquid, a ratio of the polymerizable component can be relatively increased, whereby not only curing is achieved at a high sensitivity, but also satisfactory developability is exhibited due to the presence of the foregoing compound at the time of development.

According to the invention, even when the addition amount of the pigment dispersant is small, a pigment dispersion liquid capable of achieving excellent dispersion stability of pigment can be provided.

Also, by containing the pigment dispersion liquid of the invention, even when the content of a pigment is large, a curable composition having excellent developability in an unexposed area while keeping curing sensitivity can be provided.

By using the curable composition of the invention for forming a colored pattern, a color filter and a solid state imaging device, each of which is provided with a high-resolution colored pattern and has sufficient coloring density even when it is a thin layer, can be provided.

Exemplified embodiments of the present invention are as follows.

(1) A pigment dispersion liquid comprising (A) a pigment, (B) a compound having a cyclic urea structure and having an acid group or a basic group, (C) a dispersant, and (D) a solvent.

(2) The pigment dispersion liquid according to (1), wherein the (A) pigment is (A-2) a pigment having a urea structure or an imide structure.

(3) The pigment dispersion liquid according to (1) or (2), wherein the (A) pigment is (A-3) a pigment having a barbituric skeleton.

(4) The pigment dispersion liquid according to (1), wherein the (B) compound having a cyclic urea structure and having an acid group or a basic group is represented by the following formula (I):

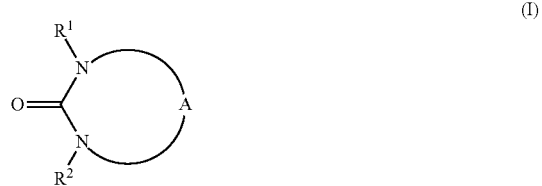

wherein $R^1$ and $R^2$ each independently represent a hydrogen atom, a substituted or unsubstituted alkyl group, a substituted or unsubstituted aryl group, a substituted or unsubstituted alkenyl group or a substituted or unsubstituted alkynyl group;

and A represents a divalent linking group that links two nitrogen atoms included in the ring structure, wherein any one of $R^1$, $R^2$ and A has an acid group or a basic group.

(5) The pigment dispersion liquid according to (4), wherein the acid group or the basic group is a phenol group, a carboxyl group, a sulfonic acid group, a phosphoric acid group, a sulfinic acid group, a monosulfate ester group or an amino group.

(6) A curable composition comprising the pigment dispersion liquid according to any one of (1) to (5), (E) a radical polymerizable compound, and (F) a photopolymerization initiator.

(7) A color filter comprising a colored pattern formed from the curable composition according to (6).

(8) A solid state imaging device comprising a colored pattern formed from the curable composition according to (6).

EXAMPLES

The present invention is more specifically described below with reference to the following Examples, but it should not be construed that the invention is limited thereto. All percentages and parts are on a mass basis unless otherwise indicated.

Examples 1 to 4 and Comparative Example 1

<Preparation of Pigment Dispersion Liquid 1>

Components of the following composition (1) were mixed with stirring for 3 hours using a homogenizer at a revolution number of 3,000 rpm, to prepare a mixed solution containing the (A) pigment.

[Composition (1)]

| | |
|---|---|
| C.I. Pigment Red 254 [(A) component] | 80 parts |
| C.I. Pigment Yellow 139 [(A) component] | 20 parts |
| 30% solution of cyclohexyl methacrylate/benzyl methacrylate/methacrylic acid copolymer (=45/50/5 [weight ratio], weight average molecular weight: 20,000, acid value: 33) in 1-methoxy-2-propyl acetate solvent [binder polymer] | 40 parts |
| SOLSPERSE 24000GR (polyester based dispersant, available from Lubrizol Japan Ltd.) [(C) component] | 40 parts |
| 1-Methoxy-2-propyl acetate [(D) solvent] | 600 parts |
| (B) specified compound (compound shown in Table 1) | 4 parts |

TABLE 1

| | (B) specified compound | Viscosity change (mPa · s) |
|---|---|---|
| Example 1 | J-1 | 2 |
| Example 2 | J-2 | 4 |
| Example 3 | J-3 | 1 |
| Example 4 | J-4 | 1 |
| Comparative Example 1 | None | 100 or more |

The structures of the respective (B) specified compounds shown in the foregoing Table 1 are as follows.

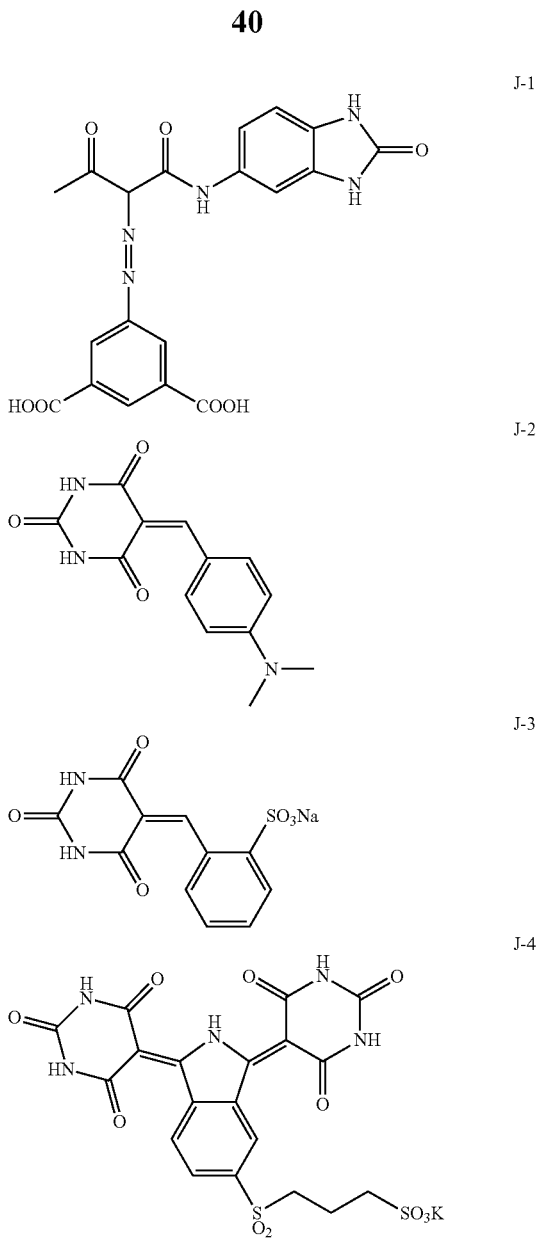

Subsequently, the thus obtained mixed solution was subjected to a dispersion treatment for 6 hours by a bead disperser, DISPERMAT (available from VMA Gerzmann GmbH) using 0.3-mmϕ zirconia beads and then further subjected to a dispersion treatment under a pressure of 2,000 kg/cm$^3$ at a flow rate of 500 g/min using a vacuum mechanism-equipped high-pressure disperser, NANO-3000-10 (available from Nihon B.E.E. Co., Ltd.). This dispersion treatment was repeated 10 times to obtain red pigment dispersion compositions (Examples 1 to 5 and Comparative Example 1).

<Evaluation of Pigment Dispersion Composition>

Each of the obtained pigment dispersion compositions was evaluated in the following manner.

(1) Measurement of Viscosity and Evaluation:

With respect to each of the obtained pigment dispersion compositions, a viscosity $\eta^1$ of the pigment dispersion composition immediately after dispersion and a viscosity $\eta^2$ of the pigment dispersion composition after an elapse of one week after dispersion (at room temperature of 25° C. to 28° C.)

were measured using an E type viscometer, thereby evaluating a degree of viscosity increase. The case where a difference between the viscosity after an elapse of one week and the viscosity immediately after dispersion is not more than 5 (mPa·s) is evaluated to be good. The results obtained are also shown in Table 1.

As shown in the foregoing Table 1, it is noted that the pigment dispersion liquids of the invention are excellent in dispersion stability of pigment with time. On the other hand, in Comparative Example 1 which did not contain the (B) specified compound, even when the pigment dispersion liquid contained the (C) dispersant, it was inferior in dispersion stability of pigment as compared with those of the Examples.

Examples 5 to 9 and Comparative Example 2

Examples for preparing a curable composition containing a coloring agent for forming a color filter to be used for solid state imaging device using each of the pigment dispersion liquids of Examples 1 to 4 and Comparative Example 1 are hereunder described.

[2. Preparation of Color Filter]

2-1. Preparation of Undercoat Layer-Provided Silicon Substrate:

Components of the following composition were mixed and dissolved to prepare a resist solution for undercoat layer.

<Composition>

| | |
|---|---|
| Propylene glycol monomethyl ether acetate (PGMEA: solvent) | 19.20 parts |
| Ethyl lactate | 36.67 parts |
| Binder polymer [40% PGMEA solution of benzyl methacrylate/methacrylic acid/2-hydroxyethyl methacrylate copolymer (molar ratio: 60/22/18)] | 30.51 parts |
| Dipentaerythritol hexaacrylate [(E) photopolymerizable compound] | 12.20 parts |
| Polymerization inhibitor (p-methoxyphenol) | 0.0061 parts |
| Fluorine surfactant (F-475, available from Dainippon Ink & Chemicals, Incorporated) | 0.83 parts |
| Photopolymerization initiator [(F) component] (TAZ-107 (trihalomethyl triazine based photopolymerization initiator), available from Midori Kagaku Co., Ltd.) | 0.586 parts |

A 6-inch silicon wafer was subjected to a heating treatment in an oven at 200° C. for 30 minutes. Next, the foregoing resist solution was coated on this silicon wafer so as to have a thickness after drying of 2 μm and further heated and dried in the oven at 220° C. for one hour to form an undercoat layer. There was thus obtained an undercoat layer-provided silicon wafer substrate.

2-2. Preparation of Curable Composition (Coating Liquid):

The following components were added to each of the pigment dispersion liquids obtained in the foregoing Examples 1 to 4 and Comparative Example 1 and mixed with stirring, to prepare curable composition solutions of Examples 5 to 9 and Comparative Example 2.

| | |
|---|---|
| Pigment dispersion liquid (composition described in Table 2) | 100 parts |
| DPHA (available from Nippon Kayaku Co., Ltd.) | 4.0 parts |
| (F) Polymerization initiator (compound described in Table 2) | 0.5 parts |
| Allyl methacrylate/methacrylic acid (molar ratio: 75/25, weight average molecular weight: 57,000) [binder polymer] | 1.0 part |

| | |
|---|---|
| Surfactant (trade name: TETRANIC 150R1, available from BASF AG) | 0.2 parts |
| Solvent: PGMEA | 100 parts |

TABLE 2

| | Used pigment dispersion liquid | (B) specified compound | (F) Polymerization initiator | Developability |
|---|---|---|---|---|
| Example 5 | Example 1 | J-1 | I-1 | Residue did not exist. |
| Example 6 | Example 1 | J-1 | I-2 | Residue did not exist. |
| Example 7 | Example 2 | J-2 | I-1 | Residue did not exist. |
| Example 8 | Example 3 | J-3 | I-1 | Residue did not exist. |
| Example 9 | Example 4 | J-4 | I-2 | Residue did not exist. |
| Comparative Example 2 | Comparative Example 1 | None | I-1 | Residue existed. |

The structures of the respective polymerization initiators used in the foregoing Table 2 are as follows.

I-1

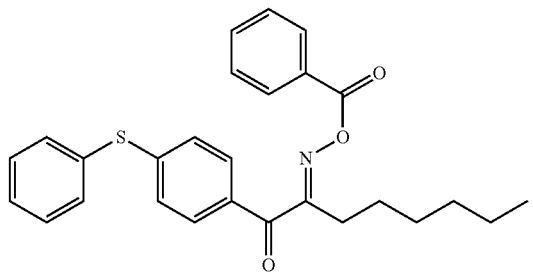

I-2

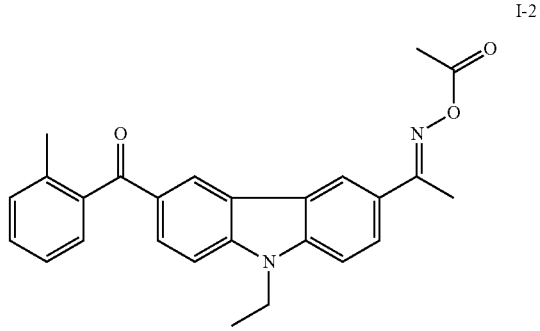

[Preparation of Color Filter by Colored Curable Composition and Evaluation Thereof]

—Formation of Pattern and Evaluation of Sensitivity—

Each of the thus obtained coloring agent-containing curable compositions of Examples 5 to 9 and Comparative Example 2 was coated on the foregoing undercoating layer-provided silicon substrate to form a curable composition layer (coating film). This coating film was subjected to a heating treatment (pre-baking) using a hot plate at 100° C. for 120 seconds so as to have a thickness after drying of 0.9 μm.

Next, the resulting coating film was exposed at an exposure amount of 100 mJ/cm² through an island pattern mask having a 1.4 μm-square pattern at a wavelength of 365 nm using an i-line stepper exposure unit, FPA-3000i5+ (available from Canon Inc.) so as to obtain a 1.4 μm-square island pattern.

Thereafter, the silicon wafer substrate on which the irradiated coating film had been formed was placed on a horizontal rotary table of a spin-shower developing machine (Model DW-30, available from Chemitronics Co., Ltd.) and subjected to paddle development at 23° C. for 60 seconds using CD-2000 (available from Fujifilm Electronic Materials Co., Ltd.) to form a colored pattern on the silicon wafer substrate.

The silicon wafer substrate on which a colored pattern had been formed was fixed on the foregoing horizontal rotary table in a vacuum chuck mode, subjected to a rinse treatment by feeding pure water from an ejection nozzle in a shower state from the upper side of the rotation center while rotating the silicon wafer substrate by a rotation unit at a revolution number of 50 rpm, and then spray dried. Thereafter, a 1.6 μm-square colored pattern was formed using a length measurement SEM, S-9260A (available from Hitachi High-Technologies Corporation), and the presence or absence of a residue in a region not irradiated with light during the exposure step (unexposed area) was observed, thereby evaluating the developability. The results obtained are also shown in Table 2.

As is clear from Table 2, it is noted that the curable compositions of Examples 5 to 9 using the pigment dispersion liquid of the invention are cured under a condition at an exposure amount of 100 mJ/cm$^2$, and thus the high sensitivity is secured, and further the developability is excellent. On the other hand, it is noted that in the curable composition of Comparative Example 2 using the pigment dispersion liquid of Comparative Example 1, the residue is formed, so that sufficient developability is not obtainable.

Examples 10 to 13 and Comparative Example 3

<Preparation of Pigment Dispersion Composition 2>
1-1. Kneading Dispersion Treatment of Pigment:

First of all, the following respective components were subjected to a kneading dispersion treatment by twin rolls.

| | |
|---|---|
| C.I. Pigment Green 36 [(A) pigment] | 50 parts |
| C.I. Pigment Yellow 150 [(A) pigment] | 50 parts |
| Resin solution (benzyl methacrylate/methacrylic acid/ hydroxyethyl methacrylate copolymer, molar ratio: 80/10/10, Mw: 10,000, solvent: propylene glycol methyl ether acetate 60%, resin solid content: 40%) | 50 parts |
| SOLSPERSE 32000GR (polyester based dispersant, available from Lubrizol Japan Ltd.: (C) component) | 35 parts |
| (D) solvent: Propylene glycol methyl ether acetate | 30 parts |
| (B) specified compound (compound shown in Table 3) | 5 parts |

Furthermore, the following component was added to the thus obtained dispersion product, and the mixture was subjected to a fine dispersion treatment the whole day and night by a sand mill. There were thus obtained pigment dispersion liquids of Examples 10 to 13 and Comparative Example 3.

| | |
|---|---|
| Solvent: Propylene glycol methyl ether acetate (PGMEA) | 350 parts |

TABLE 3

| | (B) specified compound or comparative compound | Viscosity change (mPa · s) |
|---|---|---|
| Example 10 | J-5 | 3 |
| Example 11 | J-6 | 4 |
| Example 12 | J-7 | 4 |
| Example 13 | J-8 | 2 |
| Comparative Example 3 | X-1 | 80 |

The structures of the respective (B) specified compounds and comparative compound (X-1) described in the foregoing Table 3 are as follows.

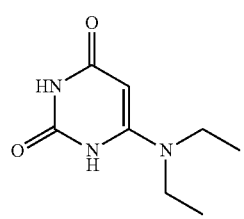

J-5

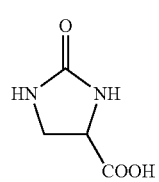

J-6

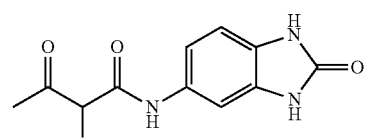

J-7

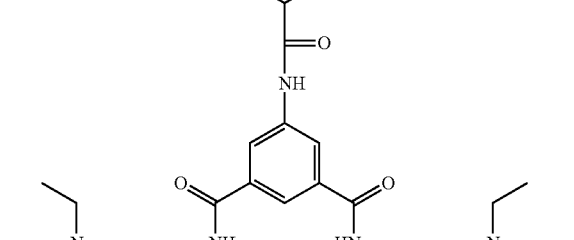

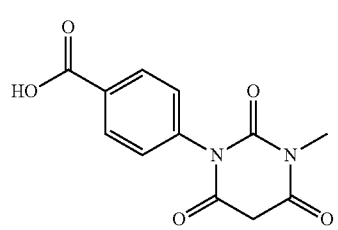

J-8

-continued

X-1

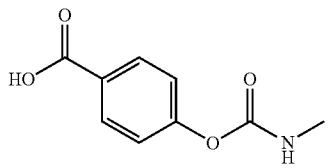

<Evaluation of Pigment Dispersion Composition>

Each of the obtained pigment dispersion liquids of Examples 10 to 13 and Comparative Example 3 was evaluated in the following manner.

(1) Measurement of Viscosity and Evaluation:

With respect to each of the obtained pigment dispersion compositions, a viscosity $\eta^1$ of the pigment dispersion composition immediately after dispersion and a viscosity $\eta^2$ of the pigment dispersion composition after an elapse of one week after dispersion (at room temperature of 25° C. to 28° C.) were measured using an E type viscometer, thereby evaluating a degree of viscosity increase. The case where a difference between the viscosity after an elapse of one week and the viscosity immediately after dispersion is not more than 5 (mPa·s) is evaluated to be good. The results obtained are also shown in Table 3.

As shown in the foregoing Table 3, it is noted that the pigment dispersion liquids of the invention are excellent in dispersion stability of pigment with time. On the other hand, in Comparative Example 3 which contained the comparative compound (X-1) in place of the (B) specified compound, though the pigment dispersion liquid was more improved in stability than that of Comparative Example 1, it was inferior in dispersion stability of pigment as compared with those of the Examples.

Examples 14 to 17 and Comparative Example 4

[Preparation of Color Filter]

Examples for preparing a curable composition containing a coloring agent (dye) for forming a color filter to be used for a solid state imaging device using each of the pigment dispersion liquids of Examples 10 to 13 and Comparative Example 3 are hereunder described.

2-1. Preparation of Undercoat Layer-Provided Silicon Substrate:

Components of the following composition were mixed and dissolved to prepare a resist solution for undercoat layer.
<Composition>

| | |
|---|---|
| Propylene glycol monomethyl ether acetate (PGMEA: solvent) | 19.20 parts |
| Ethyl lactate | 36.67 parts |
| Binder polymer [40% PGMEA solution of benzyl methacrylate/methacrylic acid (molar ratio: 75/25)] | 30.51 parts |
| Dipentaerythritol hexaacrylate [(E) photo-polymerizable compound] | 12.20 parts |
| Polymerization inhibitor (p-methoxyphenol) | 0.0065 parts |
| Fluorine surfactant (F-475, available from Dainippon Ink & Chemicals, Incorporated) | 0.80 parts |
| (F) Photopolymerization initiator (compound described in Table 4) | 0.50 parts |

A 6-inch silicon wafer was subjected to a heating treatment in an oven at 200° C. for 30 minutes. Next, the foregoing resist solution was coated on this silicon wafer so as to have a thickness after drying of 2 μm and further heated and dried in the oven at 220° C. for one hour to form an undercoat layer. There was thus obtained an undercoat layer-provided silicon wafer substrate.

2-2. Preparation of Curable Composition (Coating Liquid):

The following components were added to each of the foregoing pigments having been subjected to a dispersion treatment and mixed with stirring, to prepare a curable composition solution.

| | |
|---|---|
| Foregoing pigment dispersion liquid | 100 parts |
| Pentaerythritol tetraacrylate | 3.8 parts |
| (F) photopolymerization initiator (compound described in Table 4) | 0.5 parts |
| Benzyl methacrylate/methacrylic acid (molar ratio: 70/30, weight average molecular weight: 70,000) | 0.7 parts |
| Surfactant (trade name: TETRANIC 150R1, available from BASF AG) | 0.2 parts |
| Solvent: PGMEA | 100 parts |

TABLE 4

| | Used pigment dispersion liquid | (B) specified compound or comparative compound | (F) Polymerization initiator | Developability |
|---|---|---|---|---|
| Example 14 | Example 10 | J-5 | I-1 | Residue did not exist. |
| Example 15 | Example 11 | J-6 | I-2 | Residue did not exist. |
| Example 16 | Example 12 | J-7 | I-1 | Residue did not exist. |
| Example 17 | Example 13 | J-8 | I-2 | Residue did not exist. |
| Comparative Example 4 | Comparative Example 3 | X-1 | I-1 | Residue existed. |

The polymerization initiators used in the foregoing Table 4 are the same compounds as those used in the foregoing Table 2.

[Preparation of Color Filter by Colored Curable Composition and Evaluation Thereof]

—Formation of Pattern and Evaluation of Sensitivity—

Each of the thus obtained coloring agent-containing curable compositions of Examples 14 to 17 and Comparative Example 4 was coated on the foregoing undercoating layer-provided silicon substrate to form a curable composition layer (coating film). This coating film was subjected to a heating treatment (pre-baking) using a hot plate at 100° C. for 120 seconds so as to have a thickness after drying of 0.9 μm.

Next, the resulting coating film was exposed at an exposure amount of 100 mJ/cm$^2$ through an island pattern mask having a 1.4 μm-square pattern at a wavelength of 365 nm using an i-line stepper exposure unit, FPA-3000i5+ (available from Canon Inc.) so as to obtain a 1.4 μm-square island pattern.

Thereafter, the silicon wafer substrate on which the irradiated coating film had been formed was placed on a horizontal rotary table of a spin-shower developing machine (Model DW-30, available from Chemitronics Co., Ltd.) and subjected to paddle development at 23° C. for 60 seconds using CD-2000 (available from Fujifilm Electronic Materials Co., Ltd.) to form a colored pattern on the silicon wafer substrate.

The silicon wafer substrate on which a colored pattern had been formed was fixed on the foregoing horizontal rotary table in a vacuum chuck mode, subjected to a rinse treatment by feeding pure water from an ejection nozzle in a shower state from the upper side of the rotation center while rotating the silicon wafer substrate by a rotation unit at a revolution number of 50 rpm, and then spray dried. Thereafter, a 1.6 μm-square colored pattern was formed using a length measurement SEM, S-9260A (available from Hitachi High-Technologies Corporation), and the presence or absence of a residue in a region not irradiated with light during the exposure step (unexposed area) was observed, thereby evaluating the developability. The results obtained are also shown in Table 4.

As is clear from Table 4, it is noted that the curable compositions of Examples 14 to 17 using the pigment dispersion liquid of the invention are excellent in developability. On the other hand, it is noted that in the curable composition of Comparative Example 4 using the pigment dispersion liquid of Comparative Example 3, the residue is formed, so that sufficient developability is not obtainable.

Examples 18 to 21 and Comparative Example 5

<Preparation of Pigment Dispersion Composition 3>

Components of the following composition (1) were mixed with stirring for 3 hours using a homogenizer at a revolution number of 3,000 rpm, to prepare a mixed solution containing a pigment.

[Composition (1)]

| | |
|---|---|
| C.I. Pigment Red 254 [(A) component] | 80 parts |
| C.I. Pigment Yellow 139 [(A) component] | 20 parts |
| Benzyl methacrylate/methacrylic acid/terminal methacryloylated polymethyl methacrylate copolymer (AA-6, available from Toagosei Co., Ltd., weight ratio: 15/10/75, weight average molecular weight: 20,000, acid value: 52) (polymer 1) | 20 parts |
| SOLSPERSE 24000GR (polyester based dispersant, available from Lubrizol Japan Ltd.) [(C) component] | 30 parts |
| (B) specified compound (compound shown in Table 5) | 3 parts |
| 1-Methoxy-2-propyl acetate | 820 parts |

Subsequently, the thus obtained mixed solution was subjected to a dispersion treatment for 6 hours by a bead disperser, DISPERMAT (available from VMA Gerzmann GmbH) using 0.3-mmϕ zirconia beads and then further subjected to a dispersion treatment under a pressure of 2,000 kg/cm³ at a flow rate of 500 g/min using a vacuum mechanism-equipped high-pressure disperser, NANO-3000-10 (available from Nihon B.E.E. Co., Ltd.). This dispersion treatment was repeated 10 times to obtain a red pigment dispersion composition.

TABLE 5

| | (B) specified compound | Viscosity change (mPa · s) |
|---|---|---|
| Example 18 | J-9 | 3 |
| Example 19 | J-10 | 4 |
| Example 20 | J-11 | 4 |
| Example 21 | J-12 | 2 |
| Comparative Example 5 | None | 80 |

The details of the respective (B) specified compounds used in Examples 18 to 21 are shown below.

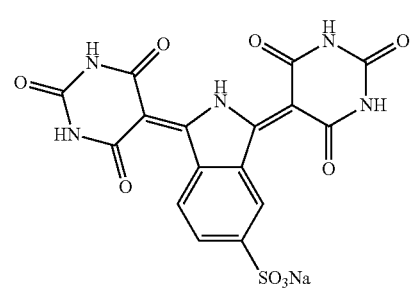

J-9

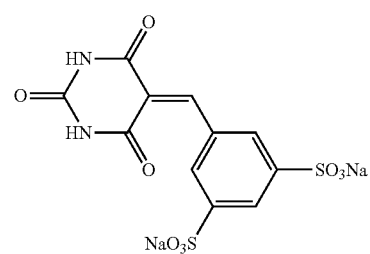

J-10

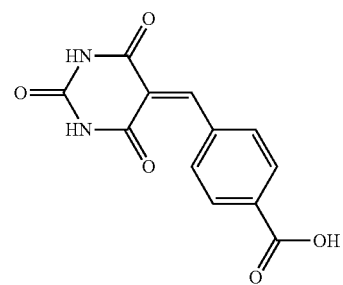

J-11

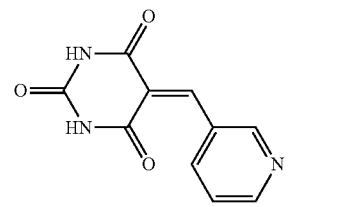

J-12

<Evaluation of Pigment Dispersion Composition>

Each of the obtained pigment dispersion liquids was evaluated in the following manner.

(1) Measurement of Viscosity and Evaluation:

With respect to each of the obtained pigment dispersion compositions, a viscosity $\eta^1$ of the pigment dispersion composition immediately after dispersion and a viscosity $\eta^2$ of the pigment dispersion composition after an elapse of one week after dispersion (at room temperature) were measured using an E type viscometer, thereby evaluating a degree of viscosity increase. The evaluation results obtained are also shown in the foregoing Table 5. Here, small viscosity change means that the dispersion stability is good.

It is noted from Table 5 that the pigment dispersion liquids of the invention are excellent in dispersibility and dispersion stability of pigment.

Examples 22 to 25 and Comparative Example 6

<2. Preparation of Color Filter>
2-1. Preparation of Curable Composition (Coating Liquid):

The following components were added to each of the foregoing pigments having been subjected to a dispersion treatment and mixed with stirring, to prepare a curable composition solution.

| | |
|---|---|
| Foregoing pigment dispersion liquid | 100 parts |
| DPHA (available from Nippon Kayaku Co., Ltd.) | 3.8 parts |
| (F) photopolymerization initiator (compound described in Table 6) | 1.5 parts or 2.5 parts |
| Benzyl methacrylate/methacrylic acid (molar ratio: 70/30, weight average molecular weight: 70,000) | 0.7 parts |
| Surfactant (trade name: TETRANIC 150R1, available from BASF AG) | 0.2 parts |
| Solvent: PGMEA | 100 parts |

TABLE 6

| | Used pigment dispersion liquid | (B) specified compound | (F) Polymerization initiator (content: parts) | Developability |
|---|---|---|---|---|
| Example 22 | Example 18 | J-9 | I-1 (1.5) | Residue did not exist. |
| Example 23 | Example 19 | J-10 | I-3 (1.5) | Residue did not exist. |
| Example 24 | Example 20 | J-11 | I-4/D-1/S-1 Weight ratio (1/1/1) (2.5) | Residue did not exist. |
| Example 25 | Example 21 | J-12 | I-4/D-2/S-2 Weight ratio (1/1/1) (2.5) | Residue did not exist. |
| Comparative Example 6 | Comparative Example 5 | None | I-3 (1.5) | Residue existed. |

The photopolymerization initiator (I-3) used in the foregoing Table 6 is 4-benzoxolan-2,6-di(trichloromethyl)-s-triazine. The structures of other photopolymerization initiators in Table 6 are as follows.

I-4:

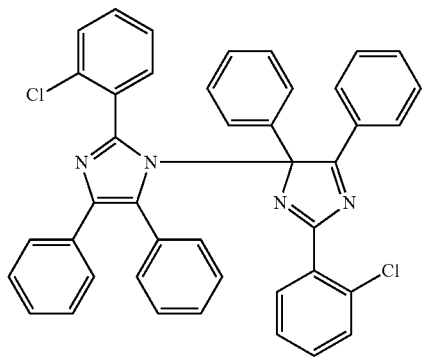

D-1:

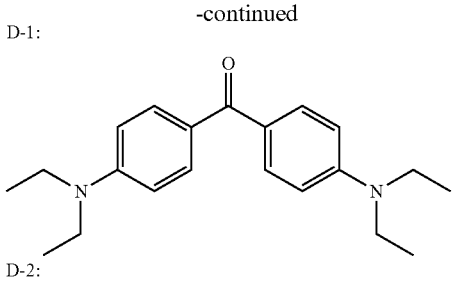

D-2:

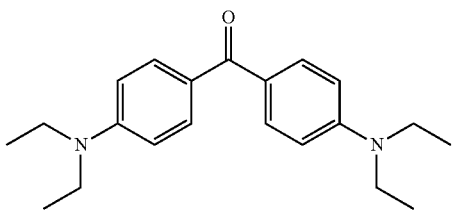

S-1:

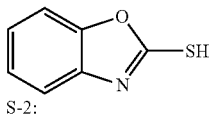

S-2:

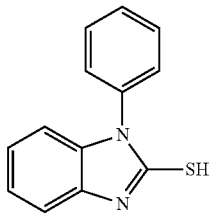

2-2. Formation of Curable Composition Layer:

The foregoing pigment-containing curable composition was slit coated as a resist solution on a glass substrate of 550 mm×650 mm under the following condition, and allowed to stand for 10 minutes as it was, and subjected to vacuum drying and pre-baking (at 100° C. for 80 seconds) to form a curable composition coating film (curable composition layer).

(Slit Coating Condition)

| | |
|---|---|
| Gap of opening of tip of coating head: | 50 μm |
| Coating speed: | 100 mm/sec |
| Clearance between substrate and coating head: | 150 μm |
| Coating thickness (thickness after drying): | 2 μm |
| Coating temperature: | 23° C. |

2-3. Exposure and Development:

Thereafter, the photocurable coating film was pattern exposed through a photomask for testing having a line width of 20 μm using a 2.5 kW extra-high mercury vapor lamp, and after the exposure, the entire surface of the coating film was covered by a 1% aqueous solution of an alkaline developing solution, CDK-1 (available from Fujifilm Electronic Materials Co., Ltd.) and allowed to stand for 40 seconds.

2-4. Heating Treatment:

After standing, pure water was sprayed in a shower state to wash away the developing solution, and the coating film having been subjected to such photocuring treatment and development treatment was heated in an oven at 220° C. for one hour (post-baking). There was thus obtained a colored resin film (color filter) on the glass substrate.

[3. Evaluation of Performance of Color Filter]

The storage stability of the thus prepared colored curable composition coating liquid and a residue in an unexposed area of the curable composition coating film (colored layer) formed on the glass substrate using the colored curable composition after exposure at an exposure amount of 100 mJ/cm², developing and post-baking were confirmed.

As is clear from Table 6, it is noted that the curable compositions of Examples 22 to 25 using the pigment dispersion liquid of the invention are excellent in developability. On the other hand, it is noted that in the curable composition of Comparative Example 6 using the pigment dispersion liquid of Comparative Example 5, the residue is formed, so that sufficient developability is not obtainable.

What is claimed is:

1. A color filter comprising a colored pattern formed from a curable composition comprising (A) a pigment, (B) a compound having a cyclic urea structure and having an acid group or a basic group, (C) a dispersant, (D) a solvent, (E) a radical polymerizable compound, and (F) a photopolymerization initiator, wherein the (B) compound having a cyclic urea structure and having an acid group or a basic group is represented by the following formula (I):

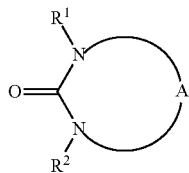

(I)

wherein $R^1$ and $R^2$ each represent a hydrogen atom: and A represents a divalent linking group that links two nitrogen atoms included in the ring structure wherein A has an acid group or a basic group.

2. The color filter according to claim 1, wherein the (A) pigment is (A-2) a pigment having a urea structure or an imide structure.

3. The color filter according to claim 1, wherein the (A) pigment is (A-3) a pigment having a barbituric skeleton.

4. The color filter according to claim 1, wherein the acid group or the basic group is a phenol group, a carboxyl group, a sulfonic acid group, a phosphoric acid group, a sulfinic acid group, a monosulfate ester group or an amino group.

5. The color filter according to claim 1, wherein the (A) pigment is selected from the group consisting of Pigment Green 36, Pigment Yellow 139, Pigment Yellow 150 and Pigment Yellow 185.

6. The color filter according to claim 1, wherein (B) is a compound having a cyclic urea structure and having an acid group.

7. The color filter according to claim 6, wherein the acid group is selected from the group consisting of a carboxyl group, a sulfonic acid group and salts thereof.

8. The color filter according to claim 1, wherein the (B) compound having a cyclic urea structure and having an acid group or a basic group is represented by the following formula (III):

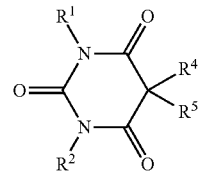

(III)

wherein $R^1$ and $R^2$ each represent a hydrogen atom; and $R^4$ and $R^5$ each represent a hydrogen atom, or an alkyl group, an aryl group, an alkenyl group or an alkynyl group, wherein each of $R^4$ and $R^5$ may further have a substituent selected from the group consisting of an alkyl group, an aryl group, an alkenyl group, an alkynyl group, a cyclic alkyl group, a cyclic alkenyl group, a cyclic alkynyl group, a hydroxyl group, a thiol group, an ether group, a thioether group, a sulfo group, a sulfonamide group, a carbonyl group, an alkoxycarbonyl group, an aryloxycarbonyl group, a thiocarbonyl group, a urea group, a urethane group, an amide group, and a heterocyclic group, wherein $R^4$ or $R^5$ contains an acid group or a basic group.

9. A solid state imaging device comprising a colored pattern formed from a curable composition comprising (A) a pigment, (B) a compound having a cyclic urea structure and having an acid group or a basic group, (C) a dispersant, (D) a solvent, (E) a radical polymerizable compound, and (F) a photopolymerization initiator, wherein the (B) compound having a cyclic urea structure and having an acid group or a basic group is represented by the following formula (I):

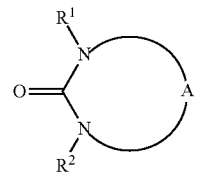

(I)

wherein $R^1$ and $R^2$ each represent a hydrogen atom: and A represents a divalent linking group that links two nitrogen atoms included in the ring structure wherein A has an acid group or a basic group.

10. The solid state imaging device according to claim 9, wherein the (A) pigment is (A-2) a pigment having a urea structure or an imide structure.

11. The solid state imaging device according to claim 9, wherein the (A) pigment is (A-3) a pigment having a barbituric skeleton.

12. The solid state imaging device according to claim 9, wherein the acid group or the basic group is a phenol group, a carboxyl group, a sulfonic acid group, a phosphoric acid group, a sulfinic acid group, a monosulfate ester group or an amino group.

13. The solid state imaging device according to claim 9, wherein the (A) pigment is selected from the group consisting of Pigment Green 36, Pigment Yellow 139, Pigment Yellow 150 and Pigment Yellow 185.

14. The solid state imaging device according to claim 9, wherein (B) is a compound having a cyclic urea structure and having an acid group.

15. The solid state imaging device according to claim 14, wherein the acid group is selected from the group consisting of a carboxyl group, a sulfonic acid group and salts thereof.

16. The solid state imaging device according to claim 9, wherein the (B) compound having a cyclic urea structure and having an acid group or a basic group is represented by the following formula (III):

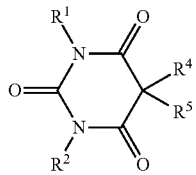

wherein $R^1$ and $R^2$ each represent a hydrogen atom; and $R^4$ and $R^5$ each represent a hydrogen atom, or an alkyl group, an aryl group, an alkenyl group or an alkynyl group, wherein each of $R^4$ and $R^5$ may further have a substituent selected from the group consisting of an alkyl group, an aryl group, an alkenyl group, an alkynyl group, a cyclic alkyl group, a cyclic alkenyl group, a cyclic alkynyl group, a hydroxyl group, a thiol group, an ether group, a thioether group, a sulfo group, a sulfonamide group, a carbonyl group, an alkoxycarbonyl group, an aryloxycarbonyl group, a thiocarbonyl group, a urea group, a urethane group, an amide group, and a heterocyclic group, wherein $R^4$ or $R^5$ contains an acid group or a basic group.

* * * * *